(12) United States Patent
Howard et al.

(10) Patent No.: US 6,485,616 B1
(45) Date of Patent: Nov. 26, 2002

(54) SYSTEM AND METHOD FOR COATING SUBSTRATES WITH IMPROVED CAPACITY AND UNIFORMITY

(75) Inventors: Bill Howard, Santa Rosa; Robert Gray, Sebastopol, both of CA (US)

(73) Assignee: Deposition Sciences, Inc., Santa Rosa, CA (US)

( * ) Notice: Subject to any disclaimer, the term of this patent is extended or adjusted under 35 U.S.C. 154(b) by 0 days.

(21) Appl. No.: 09/473,980

(22) Filed: Dec. 29, 1999

(51) Int. Cl.$^7$ .......................... C23C 14/34; C23C 16/00
(52) U.S. Cl. ............................ 204/192.12; 204/298.15; 204/298.27; 204/298.28; 204/298.29; 427/255.5; 427/248.1; 118/728; 118/729; 118/730
(58) Field of Search .................. 204/192.12, 298.15, 204/298.17, 298.28, 298.29; 427/255.5, 248.1; 118/728, 729, 730

(56) References Cited

U.S. PATENT DOCUMENTS

| | | | | |
|---|---|---|---|---|
| 4,508,056 A | * | 4/1985 | Bruel et al. .................. | 118/730 |
| 4,814,056 A | * | 3/1989 | Welty .......................... | 118/729 |
| 4,877,505 A | * | 10/1989 | Bergmann ............. | 204/192.38 |
| 5,182,256 A | * | 1/1993 | Itozaki et al. .......... | 204/298.27 |
| 5,618,388 A | | 4/1997 | Seeser et al. | |
| 5,714,009 A | | 2/1998 | Boling | |
| 5,961,798 A | * | 10/1999 | Robinson et al. ....... | 204/298.25 |

* cited by examiner

*Primary Examiner*—Rodney G. McDonald
(74) *Attorney, Agent, or Firm*—Duane Morris LLP

(57) ABSTRACT

A system and method for coating substrates. The coating process includes an improved capacity and uniformity through the addition of a second motion component in which the substrates move in a closed path. A major portion of the path is linear and the configuration of the coating machine is such that all substrates follow the same trajectory with respect to the machine during the coating process, resulting in a coating which is substantially the same for all substrates.

62 Claims, 20 Drawing Sheets

FIGURE 20a
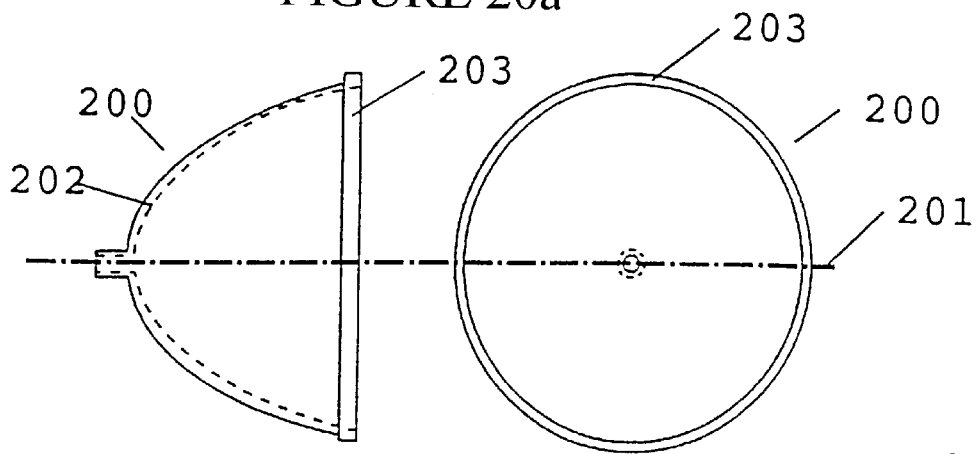
FIGURE 20b
FIGURE 21
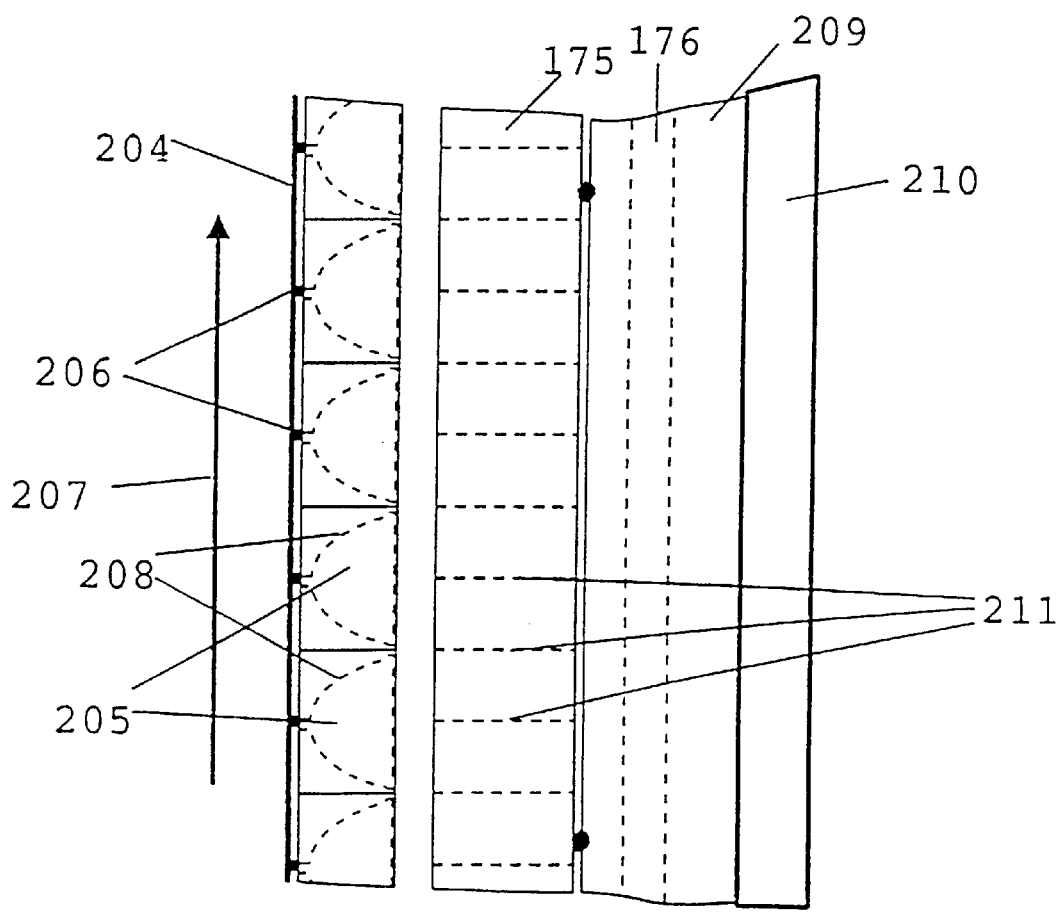

SYSTEM AND METHOD FOR COATING SUBSTRATES WITH IMPROVED CAPACITY AND UNIFORMITY

BACKGROUND OF THE INVENTION

The present invention applies to the field of coating substrates using processes in which a high level of coating uniformity is required. Such processes may use physical vapor deposition (PVD) or sputtering to apply the coating.

Typical coating processes that achieve a high level of uniformity generally use an arrangement similar to the arrangement shown in FIG. 1. A process that uses this arrangement is typically called a "long throw" process, because there is often a considerable distance between the source of coating material and the substrates. In FIG. 1, the source 1 is shown as a cylindrical can representative of a vapor source for a PVD process in which the can contains the material being evaporated. The can is substantially a point source of material. In a long throw sputtering process, the source is typically a sputtering target, which is usually larger than the evaporative source. As disclosed by FIG. 1, the typical arrangement includes substrates 2 carried by a platen 5. Several platens may be mounted on a rack 3.

To achieve a uniform coating on the substrates, two distinct motions are typically applied to the substrates 2. The first motion is provided by rotation of the rack 3 about the axis 4. The second motion is provided by rotation of the platen 5, which holds the substrates, about its axis 6. The compound motion produced by the combination of the first and second motions is called "planetary rotation".

In processes employing planetary rotation, the rack and platen have different rates of rotation. Radial reference lines 7 and 8 have been drawn on the rack 3 and platen 5, respectively and a reference line 9 connects the two axes of rotation. As the rack 3 and platen 5 rotate, the angles that the projections of the lines 7, 8 and 9 make will change. At a first instant of time the lines 7 and 8 make certain angles with the line 9. If the motions of rack and platen are generated by mechanical means such as gears or chains connected to the same source of motion, then at some later second instant of time lines 7 and 8 will make the same angles with the line 9. The time interval between the second and first instants of time (during which both rack and platen will complete a whole number of rotations) may be referred to as the period. The first and second motions are selected such that a large number of revolutions of both rack and platen occurs during the period. This selection causes all substrates mounted at the same distance from the axis 6 of the second rotation to experience almost exactly the same path within the chamber during one period. Therefore, the coating applied to all substrates equidistant from the center will be the same.

In the process disclosed in FIG. 1, the uniformity of the coating that is applied to a point on a substrate varies with the distance from that point to the axis of the second motion. In order to achieve a given level of uniformity, the region where the substrates may be placed is limited to the space between circles 10 and 11. As the requirement for uniformity becomes more stringent, or as the deposition becomes less uniform, the radial distance between the circles decreases, limiting the number and size of substrates that may be coated in a single process.

For processes requiring uniform deposition over a large area, the distance between the source 1 and the substrate 2 is generally considerably greater than the radial distance between circles 10 and 11. In addition, masks, such a sector masks, which may move in a third motion about the axis of the second rotation 6, or fixed "wall" masks, may be used to improve uniformity. The large distance between the substrate 2 and the required masks reduces the deposition rate of the process, resulting in a long and expensive process to produce a limited number of coated substrates.

Another process currently employed is commonly referred to as a "short throw" sputtering processes. In a short-throw process, the distance between the source of material (sputtering target) and the substrates is usually only a few inches. These short throw processes include "batch processes" in which the substrates are transported past a source of coating material by a rotating drum and "in-line" processes in which a transporting mechanism carries the substrates past the source in a substantially straight path. Such processes are widely used in industry to apply coatings to substrates. For example, U.S. Pat. No. 5,714,009 to Bartolomei, commonly assigned with the present application, discloses such a process. The Bartolomei patent, incorporated by reference herein, describes arrangements for producing coatings by microwave-assisted sputtering. In the disclosed process, both rotating drums and linear transport mechanisms are used to transport substrates past sputtering targets and microwave energized plasma generators in a reactive sputtering process. FIG. 2 depicts one of the possible arrangements.

Referring to FIG. 2, a sputtering chamber 21 contains a rotatable drum 22 which carries substrates 23 in a first motion parallel to the direction of the arrow 24 past an elongated sputtering target 25 and past an elongated microwave-energized plasma generator 26. The substrates 23 are arranged in rows that are parallel to the substrate motion and columns perpendicular to that motion. The target 25 and plasma generator 26 are typically mounted on the chamber wall, and are visible in FIG. 2 because a portion of the wall has been cut away. Other sputtering targets and plasma generators, not shown, may also be mounted on the chamber wall. Usually additional targets and plasma generators will have the same vertical dimensions and will be mounted in the same vertical position as the targets and generators shown in FIG. 2.

During the sputtering process, material will be sputtered from the sputtering target 25 on to the substrates 23 where it will react with a reacting gas in the chamber to produce the desired coating. It is almost always necessary to assure that all of the substrates receive a coating that has nearly the same properties. In particular, the amount of deposited material per unit area on each substrate must generally be the same within a prescribed limit.

The amount of material deposited on a given substrate depends on the location of the substrate in the direction of the longer length of the target. The arrow 27 indicates this direction, referred to throughout the application as the "z direction". The deposition of material is highest at the center of the sputtering target and decreases to zero at extreme distances from the center. In FIG. 2, the lines 28 and 29 at the ends of arrow 27, bound the region within which uniformity of deposition remains within tolerance. It is typically necessary to restrict the size of the region in the z direction so that the difference between the deposition on the center substrates and on the end substrates lies within the acceptable tolerance. Thus, the number of substrates in each column is the number that may be mounted between these limits. This number will be reduced in processes in which a tighter tolerance is imposed.

FIG. 3a is a graph illustrating the correlation between the amount of deposited material and the position of the substrate along the vertical column (i.e. position in the z direction). Curve 30 in FIG. 3a applies to the batch process of FIG. 2 and shows the amount of deposited material per unit area at substrate locations along the z direction. The target generating the curve disclosed in FIG. 3a is assumed to be "ideal", that is, it has a uniform rate of sputtering at all locations.

The deposition of material on the substrates is highest at point 31, which lies opposite the center of the target. At locations 32 that lie opposite the ends of the target the deposition is reduced to approximately half of the center value. Arrows 33 are provided to indicate the tolerance for the process. The limits of the area within which substrates may be placed and still meet the tolerance are reached when the difference between the maximum (center) value and the value at the limit equals the tolerance. Lines 34 are provided to show the limits. The tolerance is always considerably less than 50%, and the limits must always be displaced inward from the ends of the elongated target resulting in a region of deposition less than the target length. It should be noted that the rate of sputtering from a real target is not perfectly uniform, therefore, the limits must be moved inward farther than shown in FIG. 3a when considering a real target. A figure similar to FIG. 3a would also apply to the process disclosed in FIG. 1.

The production rate of a coating process is proportional to the number rows of substrates being coated at one time. The number of rows is limited by the target size. Therefore, high production rates require large targets. Large targets are expensive, difficult to maintain, subject to uniformity variations along their length, and require large and expensive power supplies. Furthermore, large targets are more vulnerable to arcing, than small targets. Arcing interferes with the stability of the coating process and degrades the quality of the deposited film.

The location of the substrates in the z direction also affects the extent to which the deposited material combines with the reactant gas. Similar to the requirements for uniformity of deposition discussed above, uniformity of reaction requires that the length of the plasma generator be greater than the width of the region 27 containing the substrates. The relatively long generators required to produce uniform reactions are expensive, difficult to maintain, require costly microwave supplies, and are subject to non-uniformity of plasma generation.

Since uniformity of reaction depends in part on local reactant gas concentration, the sputtering process shown in FIG. 2 requires a system for controlling the flow of reaction gas. The system employs vents which admit the gas at prescribed locations at carefully controlled rates. Flow is regulated by flow controllers which may be actuated by computer generated inputs. The flow control system is often complex and expensive.

FIG. 4 discloses an "in line" sputtering process that employs a substrate transport mechanism for moving the substrates in a straight line. The system includes a sputtering chamber 41, which is shown with its wall cut away. The chamber 41 contains the linear transport mechanism 42, such as a belt or web, which carries substrates 43 in a first motion parallel to the direction of the arrow 44 past an elongated sputtering target 45 and an elongated microwave-energized plasma generator 46. The direction of first motion may change direction during a single process as indicated by arrow 44. As shown in FIG. 2, the substrates are arranged in rows that are parallel to the length of the target and perpendicular columns. Both the target and plasma generator are mounted on the chamber wall. Other sputtering targets and plasma generators, not shown, may also be mounted on the chamber wall. These additional targets and generators will normally have the same length and will be mounted in the same position measured along the columns as the target 45 and generator 46 that are shown. Material is sputtered from the sputtering target 45 and then combines with a reacting gas to produce the desired coating. The requirement to achieve a desired level of uniformity limits the area in which substrates may be coated to the area between the lines 47.

The relations between the degree of uniformity and the size, cost and complexity of the batch process of FIG. 2 also apply to the in line process of FIG. 4. In both processes, the substrates move so that the center of each substrate in a given row remains at a fixed distance from a plane that contains the direction of motion and which bisects the process (xy plane). This distance is different for each substrate in a particular column. Conditions such as deposition rate, reactive gas concentration, and plasma density tend to vary as the distance changes. Therefore, it is difficult to achieve a high degree of coating uniformity in either of these process without incurring unacceptable production cost.

Variations based on the concepts illustrated in FIG. 1, 2, and 4 are known to the prior art. U. S. Pat. No. 5,618,388, issued to Seeser et al. and incorporated by reference herein, discloses a variety of coating processes. FIGS. 10 and 11 of the Seeser patent disclose modifications of the process disclosed in FIG. 2 where the top and bottom of the chamber have been moved away from the drum to make the chamber longer and to provide space at both ends of the drum for movement of the drum in a reciprocating motion in the directions indicated by the double-headed arrow 27 of FIG. 2. The reciprocating motion combines with the conventional rotary motion indicated by the arrow 24, causing the substrates to move in a helical path with respect to the chamber and the sputtering targets. The substrates mounted on the top of the drum move in the top portion of the chamber, while the substrates on the bottom of the drum move in the bottom portion of the chamber. The substrates mounted in the center of the drum move in a path that extends into both ends of the chamber. It is apparent that all of the substrates do not travel within the same region of the chamber and, as a result, are not exposed to the same conditions of deposition.

FIG. 3b is a graphical representation of the coating thickness deposited on the substrates using the Seeser process. Curve 30 is a plot of deposition per unit area on a substrate as a function of the distance of the substrate from the center of the target. The distance is measured along the z direction, and the curve 30 applies when no reciprocating motion is present. The location of the center of the target is at the center of the horizontal axis.

When reciprocating motion of the substrates is added, as disclosed in the Seeser patent, the range of z over which deposition occurs is increased. Consequently, the range of z over which deposition is plotted in FIG. 3b has been expanded. The target extends over the range between the lines 32 in FIG. 3a and FIG. 3b. The range of z over which curve 30 extends is somewhat more than a full target length in both directions from the center of the target. As the distance from the center of the target increases above half of the target length, the deposition value given by curve 30 decreases rapidly toward zero.

Considering the process in which the reciprocating motion of the substrates occurs as described above, and where the reciprocating motion has the same constant speed regardless of the direction of rotation of the drum. The reciprocating motion will carry the substrates located at the center of the target through the region between the lines 32 (the "center region"). The reciprocating motion has constant velocity, thus, the substrates will receive equal deposition at all locations within the region. The deposition on the substrate may be obtained by computing the average of curve 30 over the center region. This average has been estimated to have the value given by the ordinate of the point 38, whose abscissa is 0, since it represents deposition on a substrate at z=0.

The substrates located at the ends of the target move through one of the regions situated between line pairs 35 or 36, (the "outer regions"). The deposition received by each of the end substrates may be calculated by averaging curve 30 over the appropriate outer region. The deposition values for the end substrates are shown by the ordinates of the points 37 and 39 whose abscissas are plus and minus half of the length of the target. The three points 37, 38, and 39 have been connected in FIG. 3b to obtain curve 40 which shows the dependence of the deposition thickness on the location of the substrates relative to the center of the target in the z direction.

The deposition is higher for the substrate at the center of the target than for the substrates at the ends of the target as disclosed in FIG. 3b. The deposition on the center substrate is obtained by averaging over the inner and outer halves of the center region. Over both of these halves the average value is the same relatively high value. The deposition on the outer substrates is obtained by averaging deposition occurring over both halves of the outer regions. The half of each outer region which is nearest the center of the target is the same as one of the halves of the center region, but the half of each outer region which is most remote from the target center has an average deposition value that is much less than the average deposition value of the half nearest the center region. Therefore, the deposition on the center substrate is greater than that on the end substrates and the process does not produce a film of equal thickness on all substrates.

The non-uniform deposition produced by the process disclosed in the Seeser patent occurs even in the case where the target is ideal (i.e, when the rate of emission from the target is constant along its length). However, if the rate of emission varies along the length of the target then the non-uniformity of the Seeser process will increase. In particular, the deposition curve 30 will not be symmetrical about the center of the target. Deposition on substrates equally spaced from the center of the target will no longer be equal.

Accordingly, it is an object of the present invention to obviate the problems of the prior art and provide a novel system and method for depositing more uniform coatings on substrates.

It is another object of the present invention to provide a novel system and method for depositing a layer of material on an array of substrates so that each substrate moves along a common path relative to each of the sources of deposition material.

It is a further object of the present invention to provide a novel system and method for depositing material on a planar array of substrates being moved-in a first rotational motion while concurrently being moved in a second non-rotational motion superimposed on the first motion.

It is still a further object of the present invention to provide a novel system and deposition process in which a planar array of substrates moves in a first motion while concurrently moving in a second motion along a linear path substantially perpendicular to the direction of the first motion.

It is yet another object of the present invention to provide a novel system and method of depositing material on an array of substrates concurrently moving in first and second motions so that each of the substrates move along a common path relative to the source of the deposition material.

It is an additional object of the present invention to provide a novel system and method for short throw deposition in which an array of substrates moves on a first transport mechanism while concurrently being moved in a second motion that does not change the position of the carrier relative to the source of deposition material.

It is still another object of the present invention to provide a novel system and method of depositing a layer of material on an array of elongated substrates being carried on a rotating cylindrical surface, while each substrate is concurrently rotating about its longitudinal axis and being moved in a direction parallel to the axis of rotation of the cylindrical array so that each substrate moves along a common path relative to the sources of deposition material.

It is still a further object of the present invention to provide a novel method and apparatus for depositing a layer of material on an array of substrates the apparatus including a first carrier for moving the substrates in a first motion and a second carrier for concurrently moving the substrates in a second motion so that each of the substrates moves along a common path relative to the sources of deposition material.

It is still another object of the present invention to provide a novel method and apparatus for depositing a layer of material on an array of substrates, the apparatus including a planar rotating first transport mechanism for moving the substrates in a first motion and a second transport mechanism including substrate holders for concurrently moving the substrates in a second motion along a common linear path extending outward from the axis of rotation of the first transport mechanism so that each of the substrates moves along a common path relative to the sources of deposition material.

It is a further object of the present invention to provide a novel method and transport apparatus for moving an array of substrates along a first linear path in a first motion while concurrently moving the substrates in a second motion along a common linear path substantially perpendicular to the path of the first motion.

It is yet another object of the present invention to provide a novel method and transport apparatus for changing the position of an array of substrates carried by a rotating drum relative to the drum.

It is yet another object of the present invention to provide a novel method and transport apparatus for carrying substrate holders along a linear path substantially parallel to the longitudinal axis of the deposition target.

It is still a further object of the present invention to provide a novel substrate holder system and method with removable substrate holders so that the substrate holders may be loaded and unloaded with substrates while other substrates are present in the coating machine.

It is an object of this invention to provide a novel coating system and method using a plurality of relatively smaller sources and plasma generators.

It is a further object of this invention to provide a novel system and method for achieving a high degree of uniformity of reaction in a reactive sputtering process without employing elaborate gas distribution systems.

It is a further object of the invention to provide a novel substrate coating system and method in which the number of substrates being coated is independent of the size of the material sources and other components.

It is a still further object of the invention to provide a novel system and method for both batch and in-line sputtering processes that achieves a high degree of coating uniformity at a low production cost.

It is a still further object of the invention to provide a novel system and method of coating substrates in which the uniformity of the deposited coating is substantially independent of the configuration of the material sources.

It is a still further objective of this invention to provide a novel long throw sputtering system and method with a reduced throw distance and physical masking.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 20a is side view of a lamp reflector to be coated.

FIG. 20b is view into the open end of a lamp reflector to be coated.

FIG. 21 is a partial side view of one embodiment of the present invention useful in coating the lamp reflector of FIGS. 20a and 20b.

DESCRIPTION OF PREFERRED EMBODIMENTS

Figure 1:
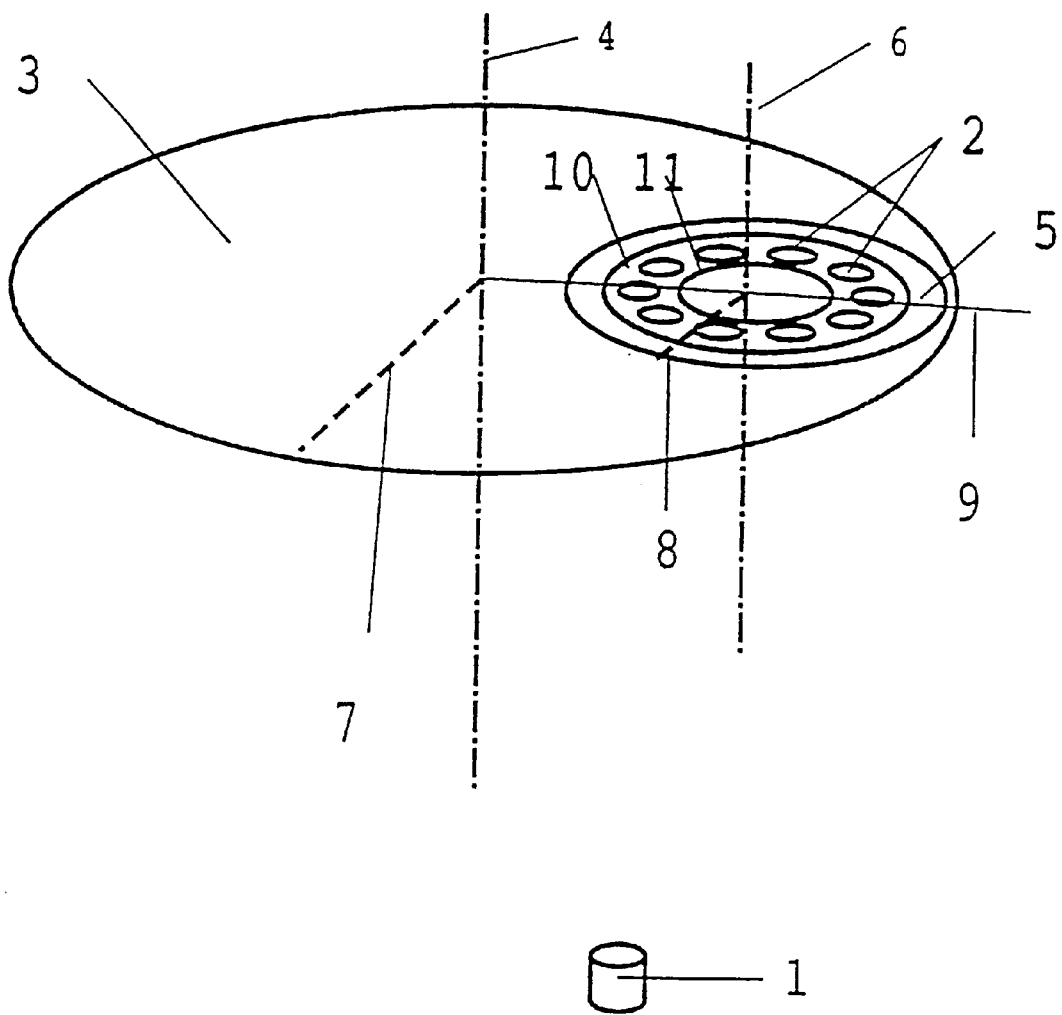
FIG. 1 is a schematic representation of a prior art "long-throw" process for achieving uniformity of deposition.

The present invention relates to the deposition of coatings on substrates as they are transported past a source of deposition material by a first transport mechanism in a first motion through the deposition zone by a rotating rack, a rotating drum, a linear drive or the like. A second transport mechanism moves the substrates in a second motion along a closed, substantially linear path relative to the first motion. Various embodiments of the invention employ different types of these second transport mechanisms and the different types may be used for different coating processes.

Substrates may be grouped and all substrates within a group follow substantially the same path, with the paths of the groups laterally displaced in the direction of the first motion. All substrates follow substantially the same path with respect to fixed objects such as material sources within the coating chamber.

A group of substrates may be arranged to form an "array" of substrates. As used herein, the term "array of substrates" means a plurality of substrates wherein two or more substrates have different positions relative to the sources of the material to be deposited when the array is moved past the sources in a first motion. For example, in a batch coating process, an "array of substrates" may comprise a cylindrical array of substrates which is moved in a first motion past the one or more sources of the material to be deposited on the cylindrical surface of a rotating drum. In such a process, the "array of substrates" includes two or more substrates having different positions along the z direction when the array is in a static condition.

Further by way of example, an "array of substrates" may comprise a planar array of substrates which is moved in a first motion past the one or more sources of the material to be deposited on a planar surface in a first linear motion. In such a "planar array of substrates", the array comprises two or more substrates having different positions along the direction of the first linear motion and two or more substrates having different positions transverse to the direction of the first linear motion when the array is in a static condition.

Still further by way of example, an "array of substrates" may comprise a planar array of substrates which is moved in a first motion past the one or more sources of the material to be deposited on a planar surface in a rotational motion. In such a "planar array of substrates", the array comprises two or more substrates having different positions along a radius extending from the rotational axis of the array.

The motion of each group of substrates is synchronized to that of the other groups of substrates, so that the time interval between when substrates in adjacent groups assume the same position relative to the path of second motion path is fixed. As a result, a plot showing the movement of the center of a substrate in the z direction would be the same for each substrate. Corresponding substrates in two different groups would follow the same path at different times. The time differences between the substrates would be fixed, and the motions of the substrates could be considered to be "phase locked" or simply "locked."

The position of a substrate along the z axis (i.e. the longer axis of the targets) at the beginning of deposition of a given layer is referred to as the "starting point" of the substrate. Thus an "array of substrates" comprises two or more substrates having different starting points in a process where the one or more targets have a "z" axis. The distance between the centers of adjacent substrates in the direction of first motion (e.g. the direction of drum rotation) is designated as "d". It is desirable that each substrate returns to its starting point at the time that deposition of the layer is completed. Note that since the motion of all the substrates is locked, if one substrate meets this condition the others will also meet this condition. Note that this condition may be relaxed somewhat if the number of drum revolutions that occurs during the layer deposition is large, unless very high uniformity is required. It is also desirable that the second motion of the substrates carry the substrate holders through a distance d during an integral number of drum revolutions. This requirement may also be relaxed somewhat as discussed below. Fulfilling these two conditions assures that the substrates travel in identical paths during the deposition of each layer.

Preferably, the speed of the substrates in the second motion direction is relatively low compared to the speed of the substrates in. the first motion direction (e.g., the direction of drum rotation). In general, the speed of the first transport mechanism ( e.g., the drum) and the speed of the second transport mechanism are selected to ensure that each substrate follows the same path with respect to the material sources. For example, if the deposition region or a sputtering target covered 40 inches in the z direction (i.e. the longitudinal axis of the drum) and the drum was rotating at one revolution per second, the speed of the second motion could be selected to be one inch per second. The substrates would move through the sputtering region on 40 equally spaced paths on both the ascending and descending portions of the second motion path. However, the requirement for a common path may be relaxed as the speed of the drum becomes relatively large compared to the speed of the second transport mechanism because of the large number of times that the substrates would pass through the sputtering region. The linear portion of the second motion may be designed to exceed 50 inches in length, so that all of the substrates would travel more than 100 inches in completing a cycle.

Motion of the substrates in the z direction need not be confined to the region of deposition, as long as each substrate has the same motion relative to a starting point. The motion of all substrates is locked, and with proper selection of speeds all substrates will follow substantially the same path through the coating chamber during a layer deposition. Therefore, the substrates will receive substantially identical coatings regardless of the nature of the second motion (i.e. motion in the z direction).

The throughput of the process may be increased by packing the substrates on the transporting mechanism as closely as possible without allowing the paths of different groups of substrates to overlap. High packing density may be achieved without overlapping paths by placing the substrates as closely as possible along the path while minimizing the distance between adjacent groups of substrates.

Figure 5:
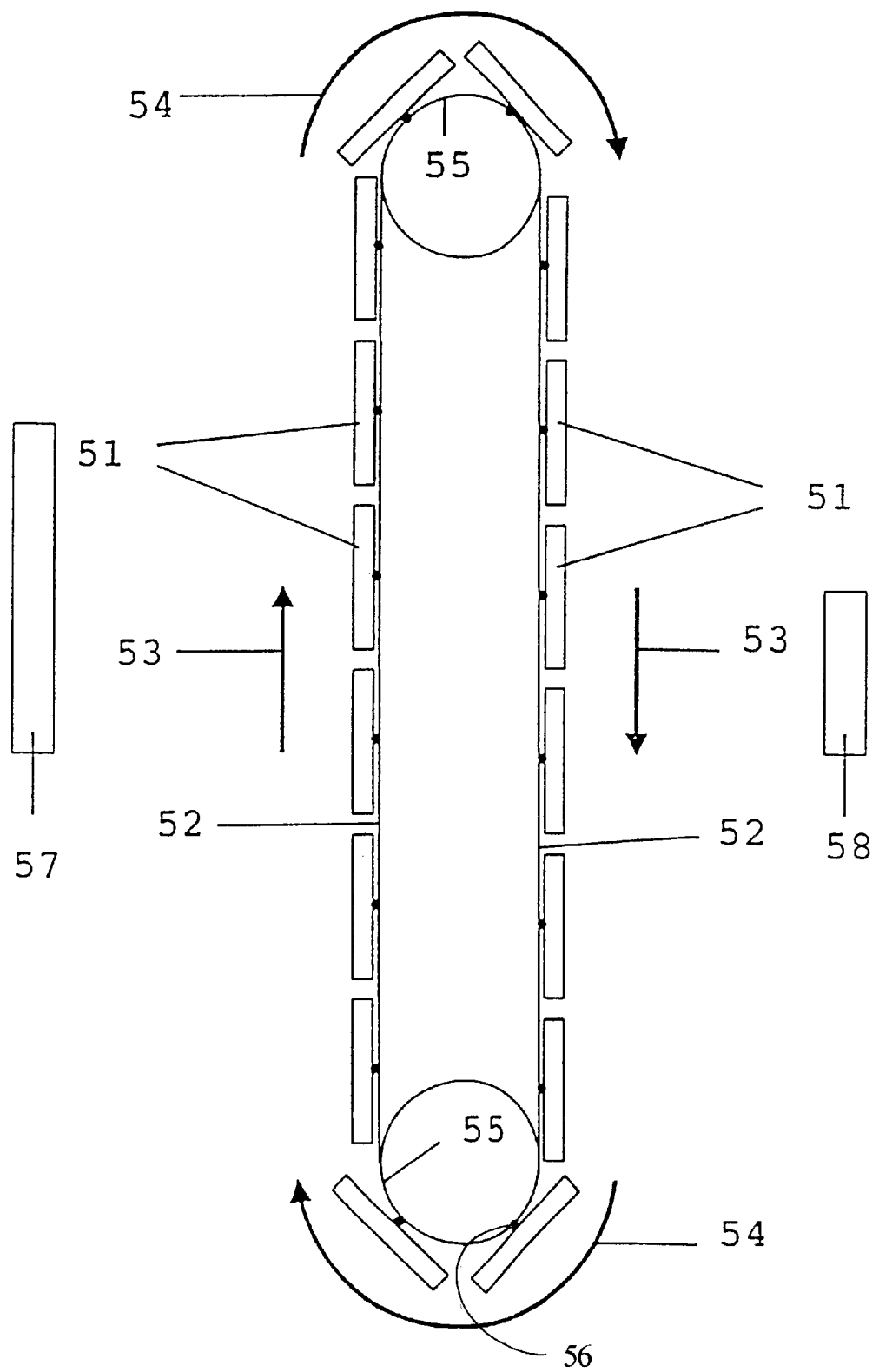
FIG. 5 is a schematic elevational view in cross section of one embodiment of a transport mechanism for moving substrates to be coated.

FIG. 5 discloses an embodiment of the present invention in which the second transport mechanism may be mounted on a first transport mechanism such as a rotatable rack, a rotatable drum or linear transport. FIG. 5 discloses a group of substrate holders 51 following a closed second motion path in the shape of a racetrack (i.e. elongated linear sections with curved connecting sections). The second motion is imparted to the substrate holders 51 by a second transport mechanism 52 which may include a belt or other similar device that is capable of carrying the substrates in the direction of the arrows 53 and 54 around the path.

The substrate holders 51 move along the straight sections and then pass around the connecting half circles 55. It is within the scope of the present invention to include any appropriate geometrical shape for reversing the direction of the movement of the substrate holders, e.g. half circles, two curves with an intervening linear sections, ellipses, etc. The radius of the circular portions of the path of second motion 55 may have any convenient value.

The substrate holders 51 may be attached to the second transport mechanism 52 by any suitable conventional attachment means 56 so that the substrate holders are substantially parallel or tangent to the second transport mechanism. As the substrate holders 51 reverse direction along the path of second motion, the holders maintain a generally tangential position relative to the second transport mechanism 52 so that material sources 57 and 58 such as sputtering targets or evaporation sources cause material to be deposited on the substrates in the substrate holders.

It is preferred that the second transport mechanism 52 be attached to the inner surface of each substrate holder by a contact 56 at the center of the adjacent surface of the holder 51. Alternatively, the attachment may be a linear connection along a line perpendicular to the direction of second motion which passes through the center of the inner surface of the substrate holder. The holders 51 may be permitted to pivot or rotate about the attachment point or line with the second transport mechanism 52 as the holders 51 move around the semicircular portions 55 of the second motion path.

The substrate holders 51 may be mounted along the second transport mechanism 52 so that each holder 51 contacts the adjacent holders 51 so long as one holder 51 does not interfere with an adjacent holder as the holders move around the half circle sections of the second motion path 55. The substrate holders may be of any suitable shape, with squares being preferred to permit dense packing along the second transport mechanism 52.

Figure 6:
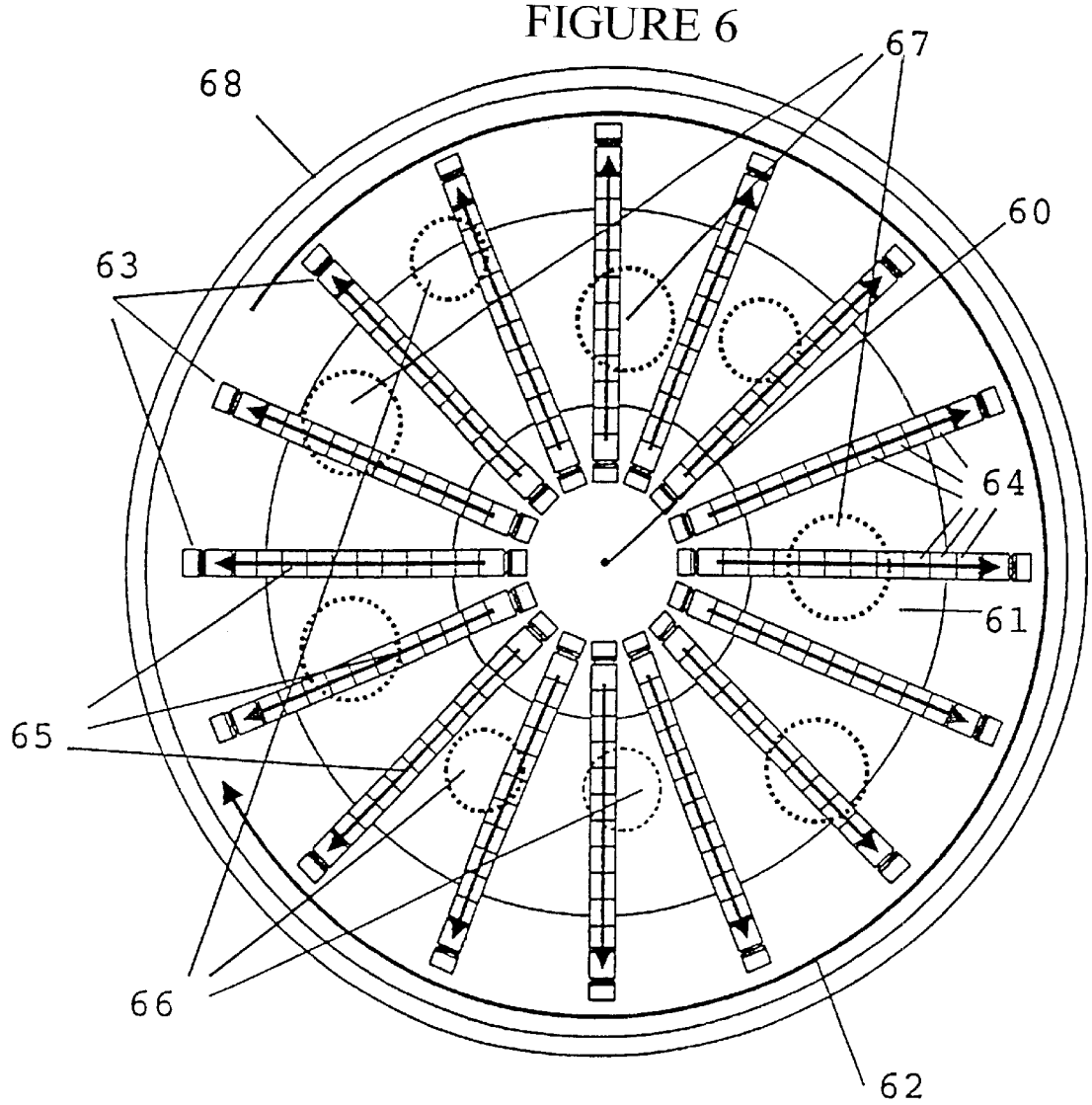
FIG. 6 is a top plan view of the transport mechanism of FIG. 5 incorporated into the system disclosed in FIG. 1.

FIG. 6 discloses an apparatus for coating a planar array of substrates which is moved past the one or more sources of the material to be deposited in a first motion by rotating the array about an axis perpendicular to the array. The process may take place within a chamber 68. As shown in FIG. 6, the first transport mechanism 61 rotates about an axis 60 to thereby move the array of substrates past the targets 67 in a rotational motion in the direction of arrow 62. The first transport mechanism 61 may be a rack 61 rotating as shown by arrow 62 about an axis 60 normal to the rack 61. One or more second transport mechanisms 63 are mounted on the first transport mechanism 61, each along a radius extending from the rotational axis 60. A plurality of substrates 64 may be mounted on each second transport mechanism 63 an moved linearly in a second motion in the direction of arrow 65. Thus the "planar array of substrates" comprises two or more substrates having different positions along a radius extending from the rotational axis in a static condition.

The platen of FIG. 1 may be replaced by a plurality of second transport mechanisms 63 similar to the second transport mechanism 52 disclosed in FIG. 5. Each of the second transport mechanisms 63 transport substrate holders 64 carrying substrates along a second motion path indicated by the arrows 65. The second transport mechanism 63 carries the substrate holders 64 alternately from the side of the rack 61 shown in FIG. 6 to the opposite side hidden from view. Substrate holders 64 are attached to the second transport mechanism 63 by linear contacts, as previously described, so that the substrates may be placed in contact with one another as they travel along the straight sections of the path of second motion. The holders 64 are shown as squares but may have any shape capable of containing the substrates to be coated.

The system includes a plurality of sources of coating material 66, such as sputtering targets or evaporation sources. The process may further include a second source 67. The second source 67 may be larger than the first 66 and may be provided in any appropriate number. While two different sized sources are shown, the present invention provides for freedom in the choice of the size of the sources. Any combination of size and number of sources of material may be selected so long as appropriate for the task.

With continued reference to FIG. 6, the second transport mechanisms 63 are conveniently arranged adjacent to one another on the rack 61 and may be spaced equally around the axis of rotation for the rack 61 along radii of circles centered on the axis of rotation 60. Sources of material to be deposited are mounted in front of or behind the rack 61 or on both sides of the rack 61. The sources 66, 67 are shown as dotted circles indicate the location of evaporation sources or circular sputtering targets mounted behind the rack 61. In contrast to the prior art, one aspect of the present invention provides for a high degree of uniformity by permitting the sources having any desired physical form to be mounted at virtually any location. This feature of the invention is illustrated in FIG. 6, where the sources are displayed in non-symmetrical locations.

Because the present invention provides for uniformity of deposition material independently of source location, the source location may be selected to optimize other parameters such as production rate. For example, the number of sources (i.e. targets) may be increased to increase production rate, or the distance between source and substrate may be decreased to achieve an improvement in the quality of the deposited film.

In another aspect, the present invention eliminates the need for extensive masking to achieve uniformity. As applied to the embodiment disclosed in FIG. 6, the walls of the chamber 68 facing the rack 61 may be substantially filled by the sources. Furthermore, the sources may be divided into groups differing as to the materials being deposited to deposit layers of different materials.

The rack 61 in FIG. 6 is shown as a circular plate similar to the rack disclosed in FIG. 1. However, any appropriate structure that may be rotated about the axis 60. It is desirable to detach each second transport mechanism 63 between processes so that may be reloaded for a subsequent process. Therefore, the rack 61 is preferentially designed to support detachable pallets that would support the individual second transport mechanisms using any suitable conventional mechanical design.

Using the detachable pallets, the machine may be unloaded and reloaded between coating processes. For example, a secondary set of substrate holders may be loaded with substrates and the corresponding second transport mechanisms mounted on pallets during a coating process. At the end of the coating process, the pallets in the machine which are then loaded with coated parts may be detached and removed from the machine and the pallets previously loaded with substrates to be coated may be attached within the machine and the next process would be started. The pallets that had been removed may then be unloaded and reloaded during the subsequent coating process and the cycle repeated.

Figure 2:
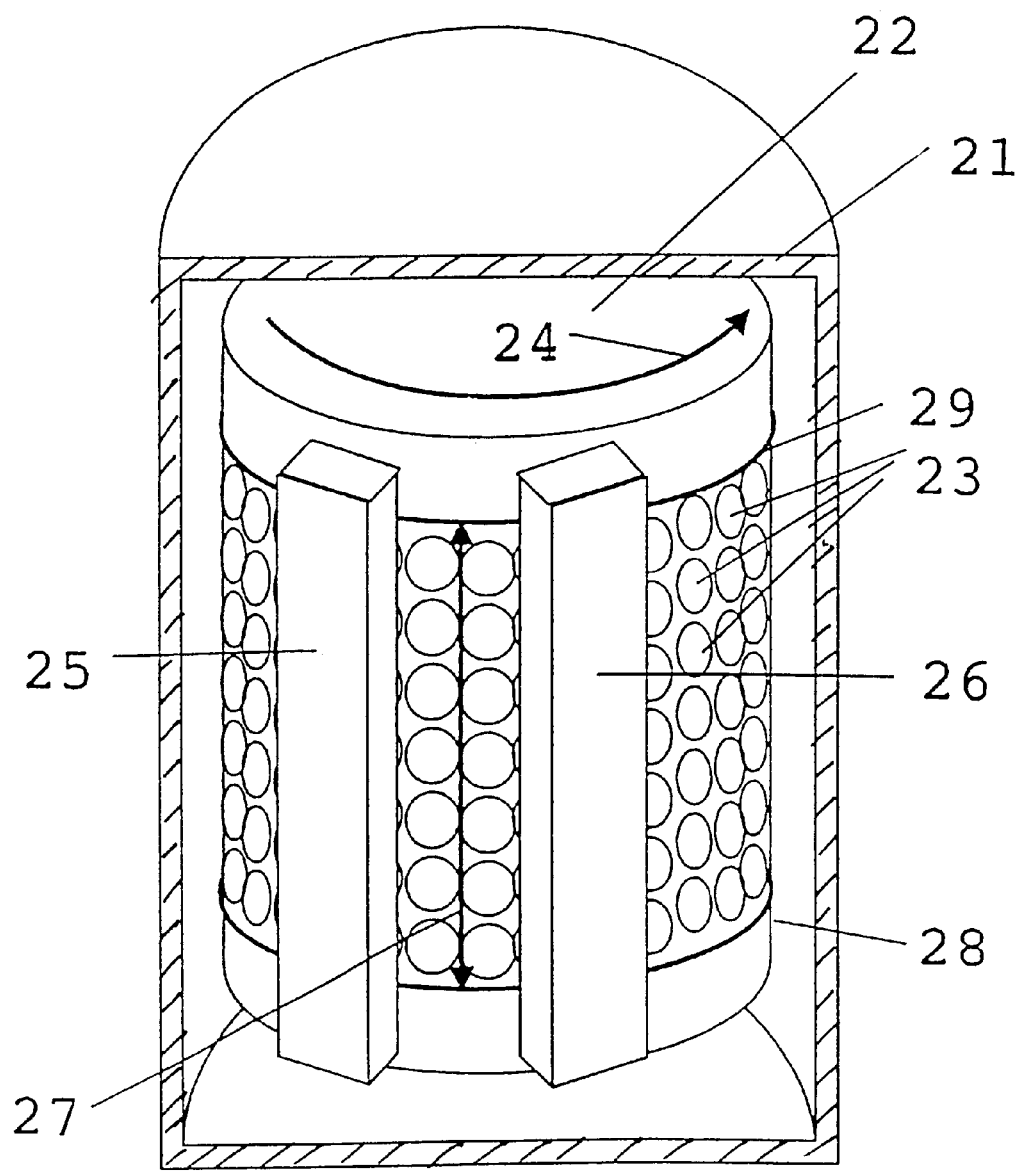
FIG. 2 is a pictorial view in partial section a prior art apparatus for sputtering material onto substrates transported by a rotating drum.
Figure 3A:
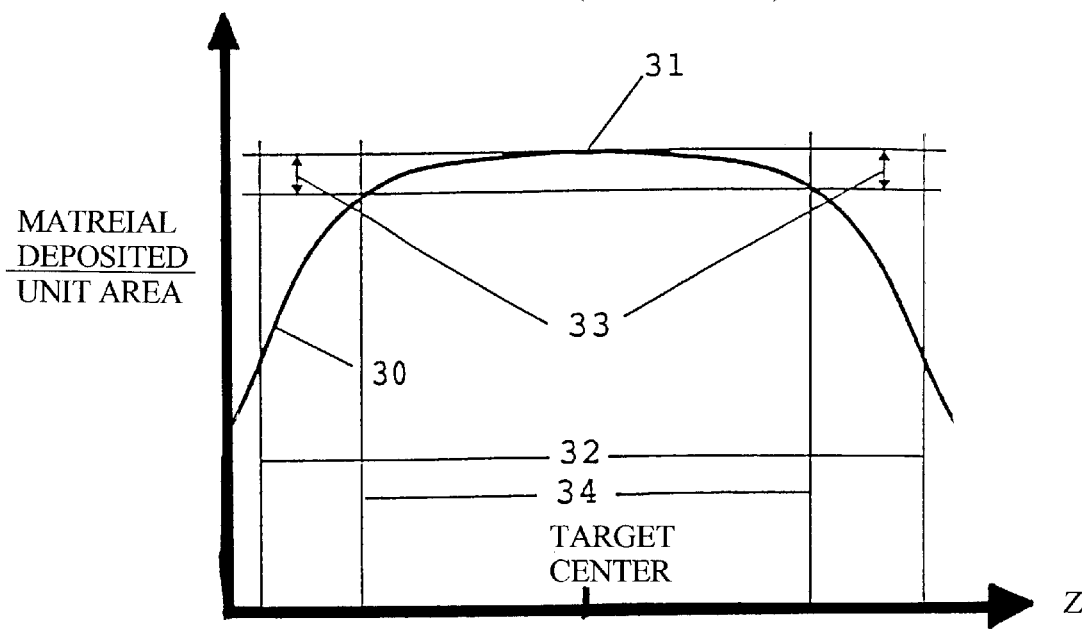
FIG. 3a is a chart showing the variation of deposition thickness in relation to the location of a point on a substrate with respect to the sputtering target of FIG. 2.
Figure 3B:
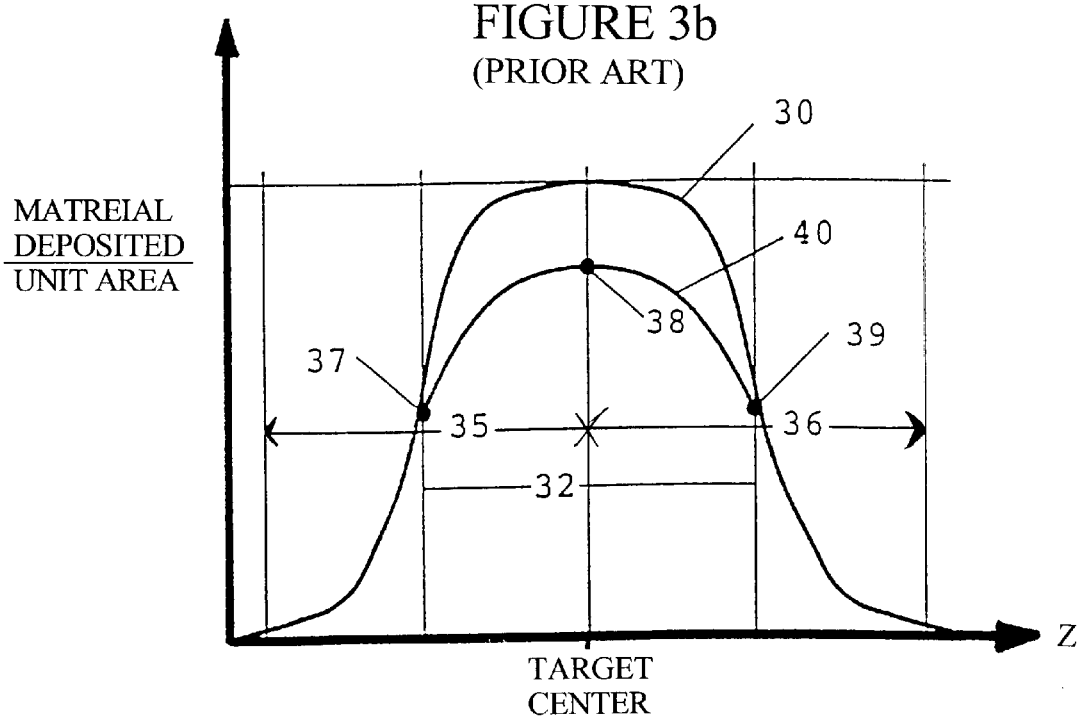
FIG. 3b is a chart showing the variation of deposition thickness in relation to the location of a point on a substrate with respect to the sputtering target of FIG. 2, for a system that includes reciprocal vertical motion of the drum.
Figure 4:
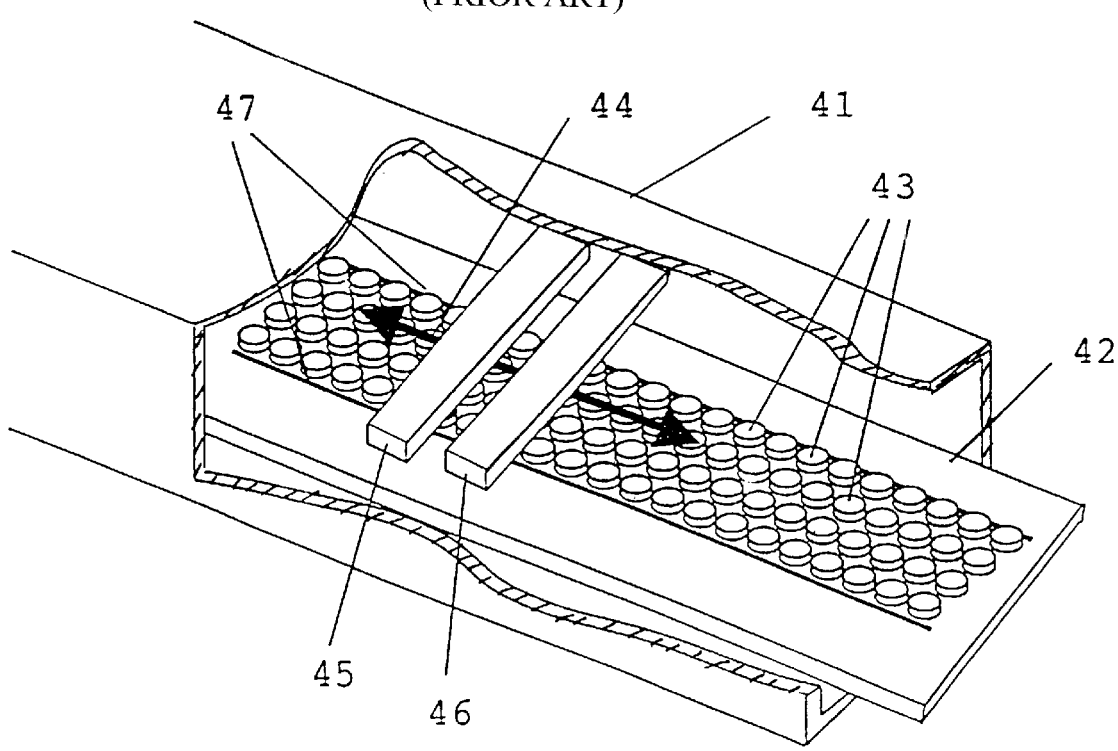
FIG. 4 is a pictorial view in partial section of a prior art process for sputtering of material onto linearly transported substrates.
Figure 7:
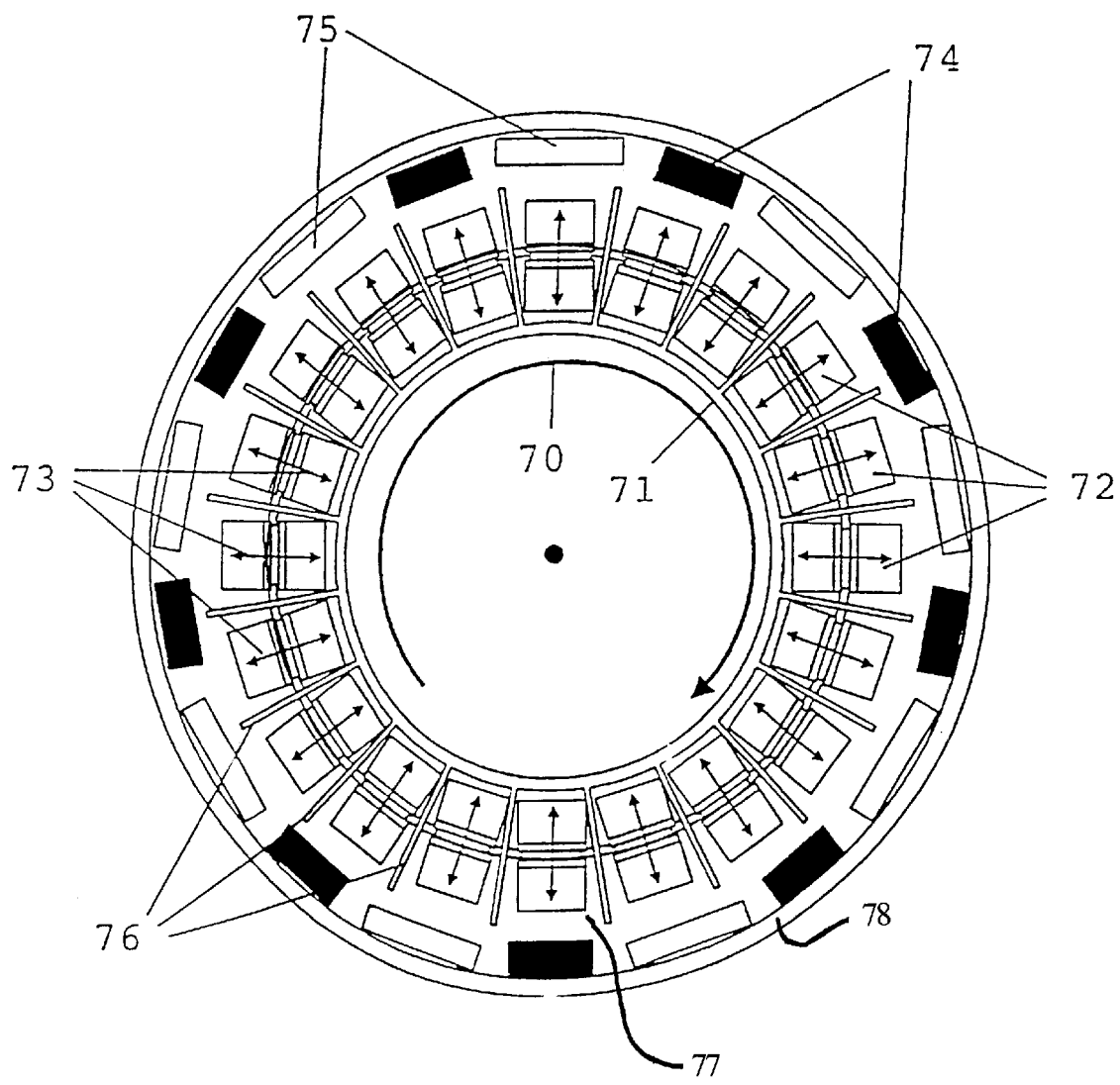
FIG. 7 is a top view of a rotating drum of the system disclosed in FIG. 2 further including the transport mechanism of FIG. 5.

FIG. 7 is a top plan view of the second transport mechanism of FIG. 5 applied to the process shown in FIG. 2, where the first motion, indicated by the arrow 70, is provided by a rotating drum 71. The drum 71 has several second transport mechanisms 77 attached around the circumference, each providing a second motion that causes substrate holders 72 to move in the second motion path shown in FIG. 5. The linear sections of the path are into and out of the paper parallel to the drum axis and, as a result, are not visible in FIG. 7. The motion connecting the linear paths is indicated by arrows 73 carrying the substrate holders 72 between the outside and inside of the drum.

During the coating process, the motion indicated by the arrow 73 may be either inwardly or outwardly directed with the second transport mechanisms 77 placed close together to increase the capacity of the process. At the greatest possible packing density, the second transport mechanisms 77 are immediately adjacent each other but without making contact so that the number of second transport mechanisms that may be mounted on the drum is the circumference of the drum divided by the width of the substrate holders.

A plurality of coating devices 74, 75 may be positioned along the chamber wall 78. The devices 74, 75 may function as sputtering targets and may deposit different materials. The sputtering targets may be located at virtually any position within the chamber, and may be situated inside or outside of the rotating drum 71. Although two types of targets are shown, more may be provided in a particular process.

Alternatively in a reactive sputtering process, the devices 74, 75 may include microwave-actuated plasma generators positioned intermittently along the chamber wall 78 with a system of ducts for releasing reactive gas into the chamber at appropriate locations. The number and location of sputtering targets or plasma generators may be selected to provide a high rate of production and good film properties, and the targets and generators are desirably mounted so as to be closely packed on the chamber wall 78.

The preferred embodiment of the apparatus 70 disclosed in FIG. 7 includes a system for removing each second transport mechanism 77 for reloading. Structural members 76 extending radially from the center of the drum may include pallets which may be detached from the drum 71 and which are attached to the individual second transport mechanisms 77.

Figure 8:
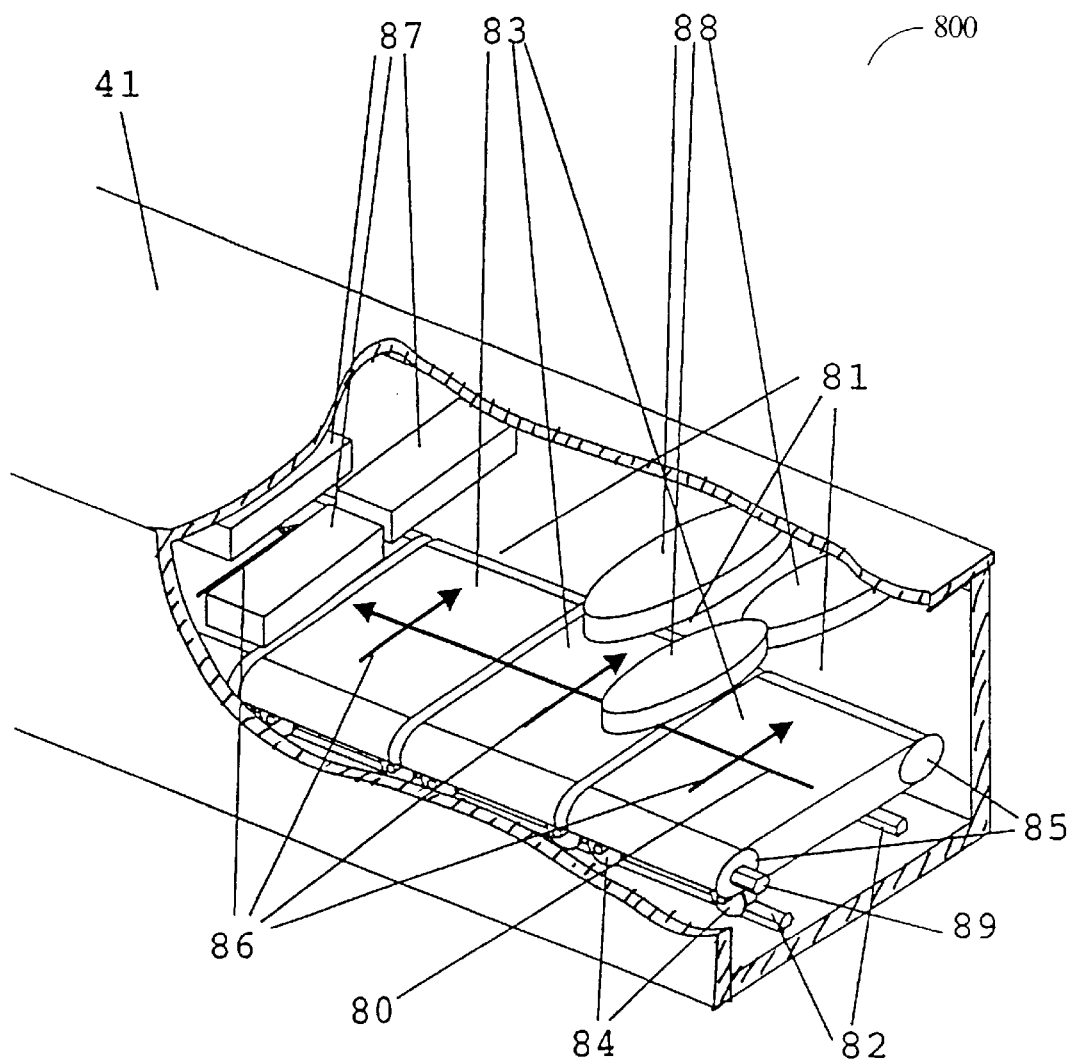
FIG. 8 is a pictorial view of the transport mechanism of FIG. 5 applied to the coating system of FIG. 4.

FIG. 8 illustrates an in-line coating process where the apparatus 800 includes a second transport mechanism 83 similar to that shown in FIG. 5 with the first motion of the substrates in the direction indicated by the arrow 80. The apparatus 800 includes a plurality of modules 81 mounted on tracks 82, each carrying a plurality of second transport mechanisms 83 with wheels 84 to facilitate travel along the tracks 82 in the direction of the first motion. The plural second transport mechanisms 83 are shown as wide belts traveling around the rollers 85 in a direction of second motion as indicated by the arrows 86. The modules 81 may be detachably coupled so that if the first and second motion is imparted to one module 81 it will be imparted to all modules. The first and second motion may be imparted to the modules by any suitable conventional mechanical means well known to those of ordinary skill in the art.

With continued reference to FIG. 8, the first transport mechanism including the wheels 84 and the tracks 82 carry the modules 81 underneath the sources of deposition material 87, 88. The sources 87 emanate a first material into a zone, and the sources 88 emanate a second material into a second zone. The sources 87, 88 may have virtually any number, size and location creating plural sputtering zones. For example, the material sources may be located at the bottom of the chamber and the modules 81 may be configured to suspend from tracks located at the top of the chamber 41. When applied to reactive sputtering, process outlets for reactive gas and plasma generators may be provided to enhance the rate of reaction.

The in-line system disclosed in FIG. 8 may be operated continuously, shutting down only when maintenance is required. In such a process, modules 81 loaded with uncoated substrates may enter the machine through a conventional air lock, roll up the track 82 and couple to the adjacent module to obtain the first motion. Once coupled, the modules engage a second motion coupling device 89 to move through a number of sputtering zones where each substrate would receive a coating layer. Uncoated substrates would enter the machine 800 in the direction shown by the arrow 80, while modules carrying coated substrates would decouple and exit the machine 800 through an air lock at the opposite end.

The modules may be repeatedly passed through the machine 800 to increase the number of layers. As shown in FIG. 8, the modules 81 may be coupled together but need not be introduced into, or removed from, the chamber 41 during coating operations. Modules may pass through all of the sputtering zones in the first direction 80 and, upon completion of the first pass, be decoupled and moved to the inlet for application of subsequent layers. The machine 800 may contain a separate sputtering zone for each material to be deposited, and the number of passes through the machine may depend on the number of layers to be deposited.

The length of the second transport mechanism 83 in the direction of the second motion may be greater than the width of the zone over which sputtered material is deposited. As a result, the apparatus 800 may accommodate a large number of contiguously mounted substrates.

Figure 9:
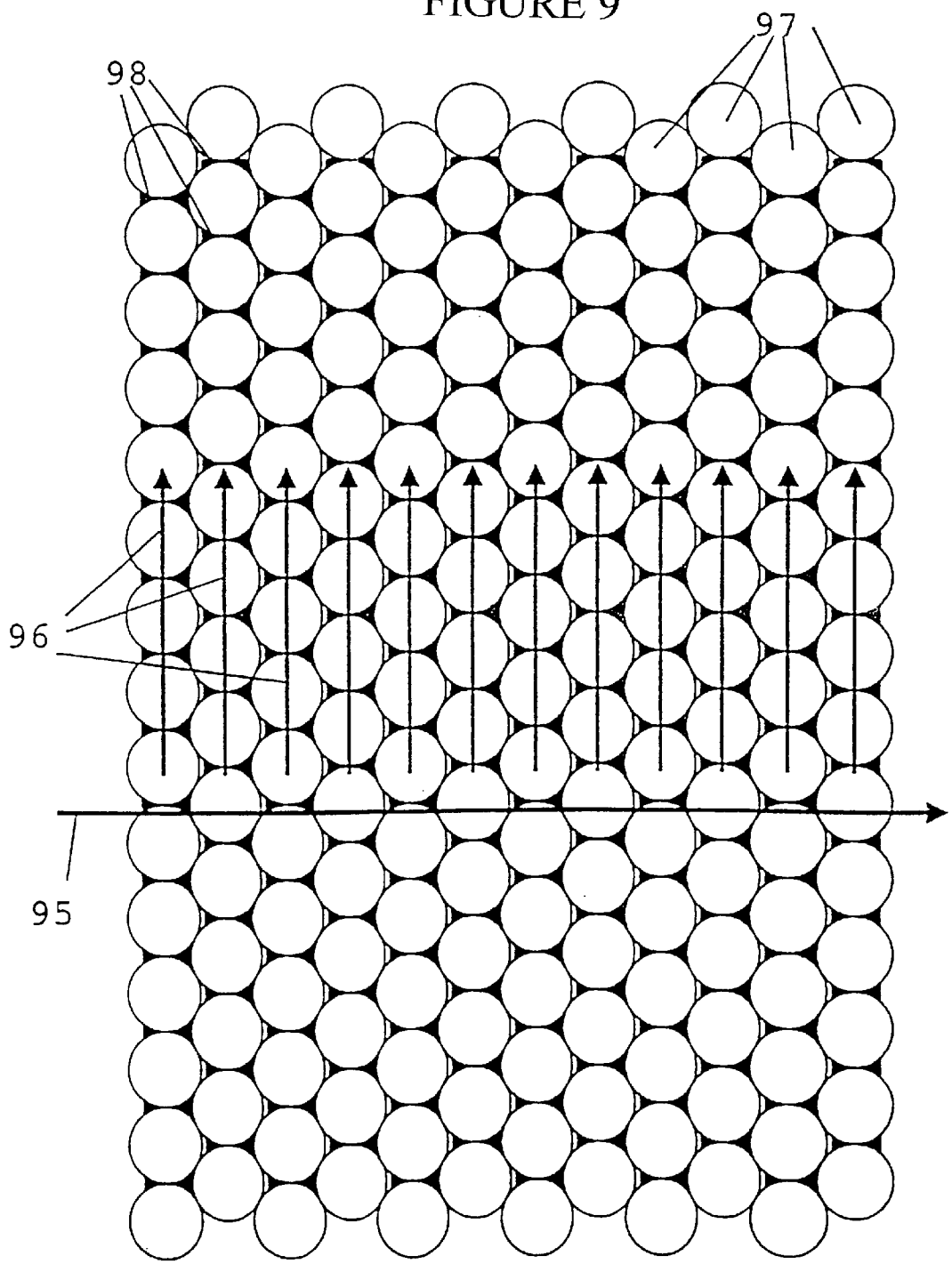
FIG. 9 is a top plan view of the substrate holders of FIG. 8 in a closely packed configuration.

FIG. 9 shows the plurality of second transport mechanisms 83 of FIG. 8 mounted adjacent to one another. The first motion is in the direction of the arrow 95 and all substrates have a second motion indicated by the arrows 96. Circular substrate holders 97 are provided to retain the substrates and the substrates may be "closely packed" so that each substrate holder touches six other substrate holders 97. This arrangement provides a 15% increase in the packing density of substrates over that which is commonly obtained. The substrate holders 97 may be mounted on moving belts 98 narrowed to accommodate the reduced spacing between the columns of substrates and all of the substrates 97 within a module may be carried by a single second transport mechanism, e.g., the individual belts 98 may be combined into a single large belt carrying all of the substrate holders.

Figure 10:
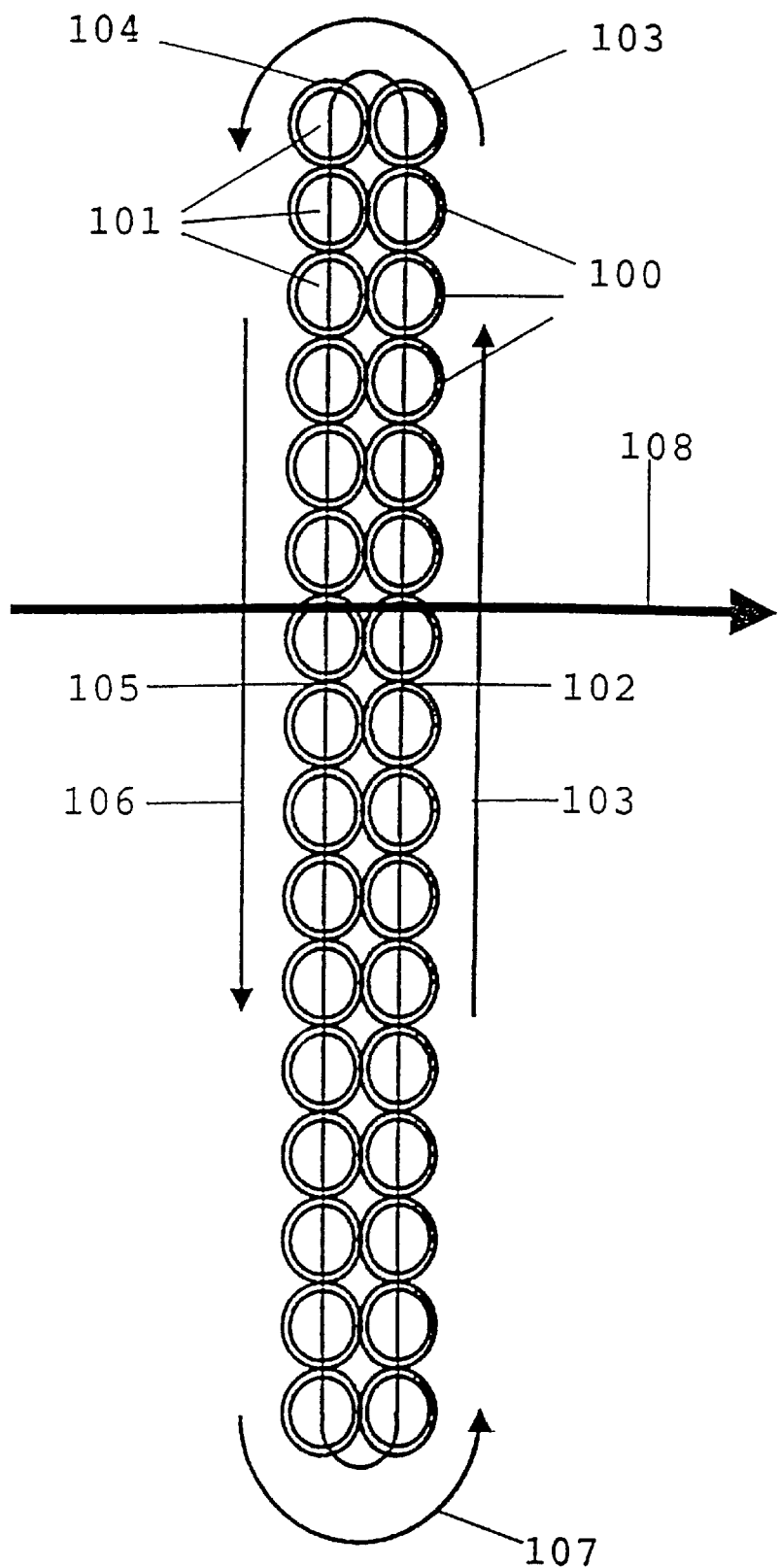
FIG. 10 is a schematic representation of a group of substrate holders moving in a direction of second motion that lies in a plane containing a first motion.
Figure 11:
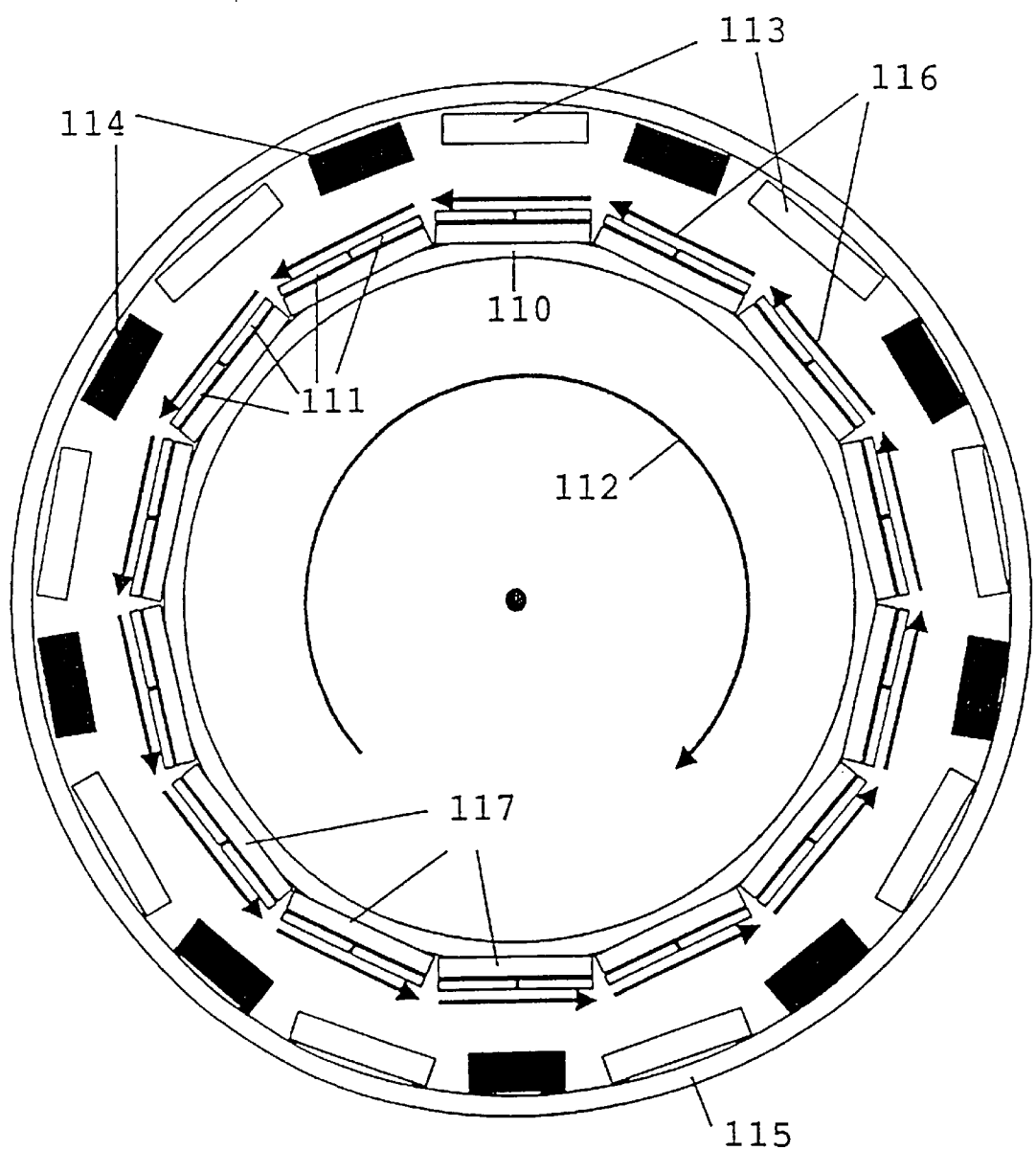
FIG. 11 is a top plan view of a drum of the system disclosed in FIG. 2 with a plurality of substrate holders moving according to the second motion illustrated in FIG. 10.

FIG. 10 discloses an alternative embodiment of the second transport mechanism in which the substrate holders 100 follow a path that lies substantially in the plane both containing the first and second motion (i.e. the xz plane) with the direction of the first motion shown by arrow 108 substantially perpendicular to the paths 102 and 105. The second transport mechanism may be mounted, , e.g., on a drum as shown in FIG. 11 or on the modules 81 shown in FIG. 8. When the second transport mechanism is mounted on a drum, the radial displacement of the substrates from the drum rotation axis remains substantially the same throughout the closed path.

Circular substrate holders 100 carry substrates 101 so that the centers of the substrates move along the ascending path 102 in the direction of the arrow 103, around the arc 104, the descending path 105 in the direction of the arrow 106 and then return to their point of origin by traveling around the arc 107. High packing density of substrates may be achieved by placing the ascending and descending columns of substrate holders and the adjacent holders as close together as possible. The lengths of the paths 102 and 105 may be selected as appropriate, but normally would be greater than the length of the material source. In order to avoid interference between adjacent holders traveling around the arcs 104 and 107, the velocity of the centers of the holders may be increased during passage around the arcs.

Taken together, the substrate holders shown in FIG. 10 form a group and additional groups may be installed adjacent one another so as to fill the entire surface of a rotatable drum or a linear transporting means. They may also be placed adjacent one another in a long-throw process.

FIG. 11 is a top plan view of a coating machine 119 that includes a rotatable drum 110 with the second transport mechanism of FIG. 10 installed on the outer surface thereof. The drum rotates in the direction 112 imparting a first motion on the substrate holders 111. Material sources 113, 114 may be mounted on the wall 115 of the chamber and may be a plurality of types of sources placed at any appropriate point in the chamber as required by the coating process. An alternating current (AC) sputtering configuration may be used in which an AC potential is applied across two adjacent sputtering targets, or across a plurality of target pairs.

The second transport mechanism of FIG. 11 includes substrate holders 111 that move out of the paper, around the semicircular portion of the path as indicated by the arrows 116 and back into the paper. The length of the second transport mechanism may be greater or less than the length of the targets 113, 114 so that the number of substrates that may be coated is not limited by the target length. To facilitate loading of the coating machine 119, the second transport mechanism may be mounted on holders or pallets 117 which may be mounted in the machine after loading. At the end of a coating process, the pallets coated substrates may be removed from the machine and replaced by pallets containing uncoated substrates. The coated substrates may then be removed from their pallets while the new substrates are being coated.

Figure 12:
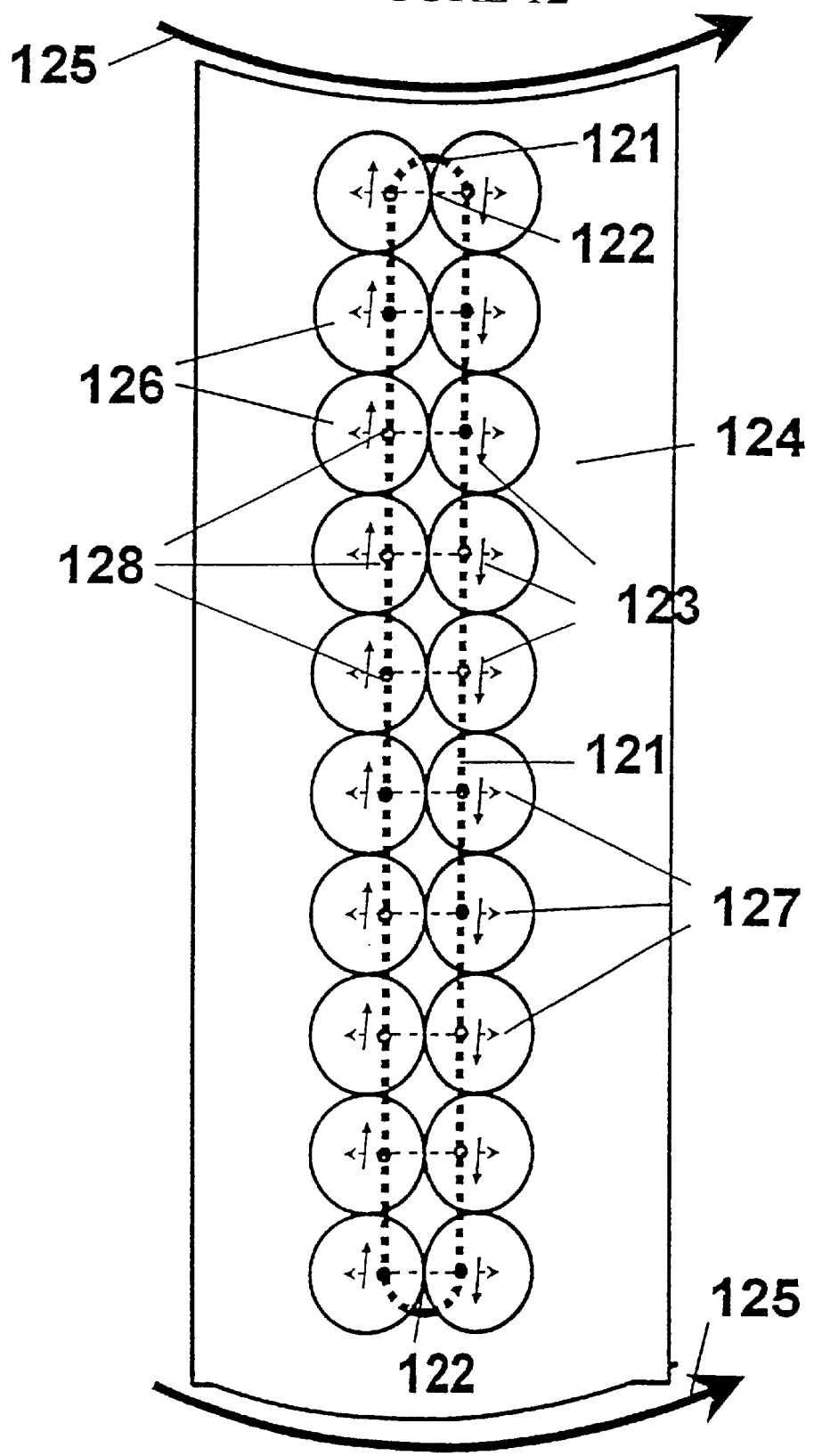
FIG. 12 is a schematic view of the mechanism for moving the substrate holders of FIG. 10.

FIG. 12 discloses a second transport mechanism for driving a group of circular substrate holders. The second transport mechanism 121 forms a continuous loop and may comprise a chain, belt or cable or any other conventional mechanical device well known to one of ordinary skill in mechanical design. The second transport mechanism 121 moves in the direction of the arrows 123, passing around sprockets or rollers and the entire mechanism may be mounted on a rotatable drum 124 which moves in the direction of the arrows 125, so that the motion of the chain or belt is generally parallel to the axis of rotation of the drum 124. Substrate holders 126 may be mounted on the transporting mechanism 121 so that the holders maintain their orientation with respect to the chain, and may be attached to the chain at points 128 which may be offset from the center of the holder. This offset allows contiguous mounting of adjacent substrate holders while avoiding mechanical interference between the holders during travel on the curved portions on the path of second motion. High packing density may be achieved by proper choice of the location of the attachment points 128.

Sputtering targets may be mounted on the wall of the coating chamber in order to sputter material onto at least part of the region on the drum in which the substrate holders move with the second transport mechanism 121 carrying the substrate holders alternately in opposite directions through the region of sputtering. While circular substrate holders are shown in FIG. 12, other shapes may be used. The second transport mechanism of FIG. 12 may also be used in the long throw process shown in FIG. 6 or in the in-line process of FIG. 8.

Figure 13:
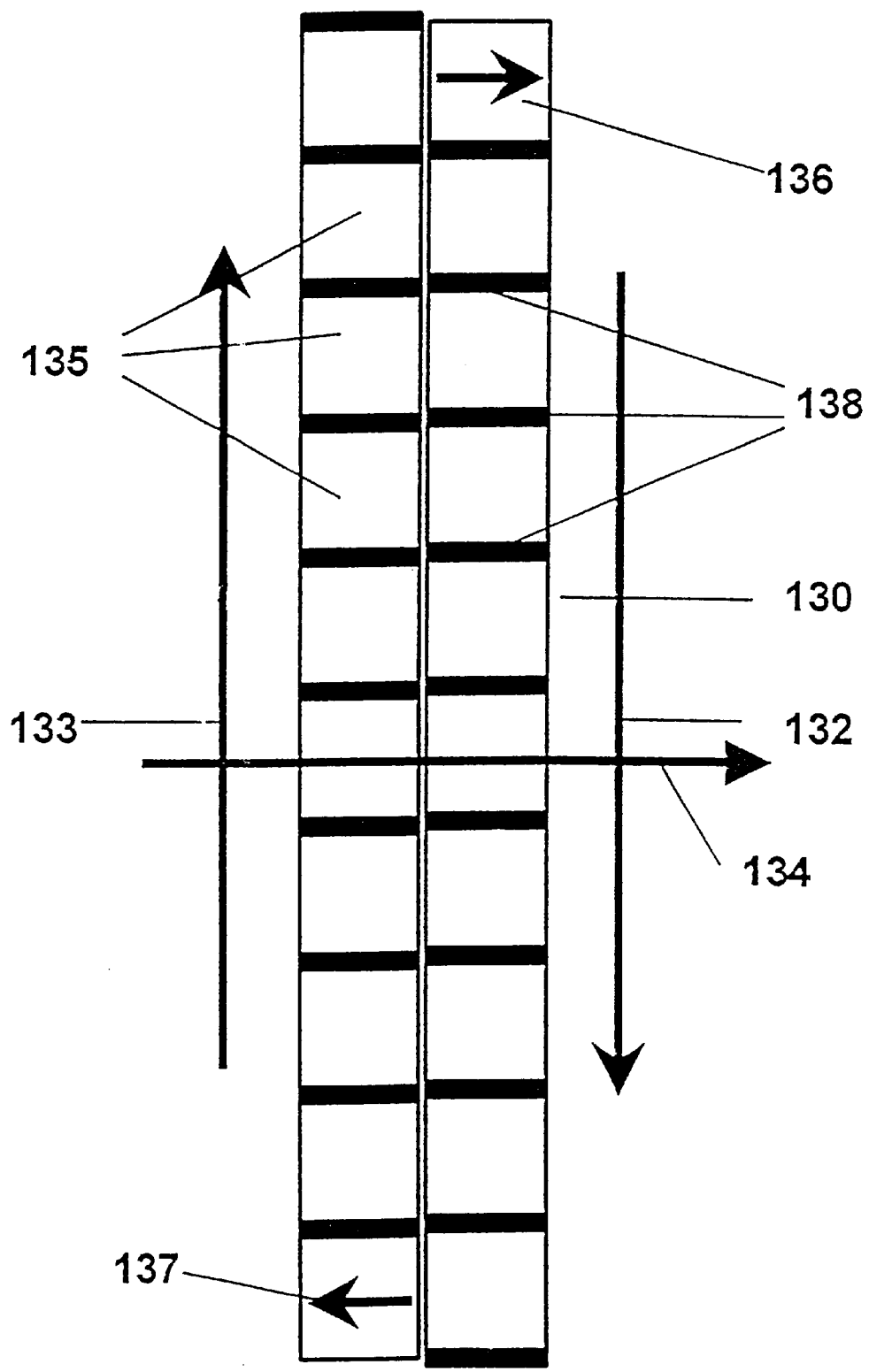
FIG. 13 is a schematic view of rectangular substrate holders moving in the manner shown in FIG. 10.

FIG. 13 discloses a second transport mechanism 130 that carries substrates in opposite directions as indicated by the arrows 132 and 133. The second transport mechanism 130 is generally used in a system that has a first motion in the direction of the arrow 134 and the substrate holders 135 are preferably square or rectangular. The transport mechanism 130 may include two separate mechanisms to move the substrate holders 135 in opposite directions with the holders transferred from one to the other mechanism in the direction indicated by the arrows 136 and 137 by any suitable conventional mechanical actuator. The motion of the second transporting mechanisms may be stopped briefly during the time when the transfer of substrate holders between mechanisms is taking place with the substrate holders 135 retained by the supporting brackets 138.

Figure 14A:
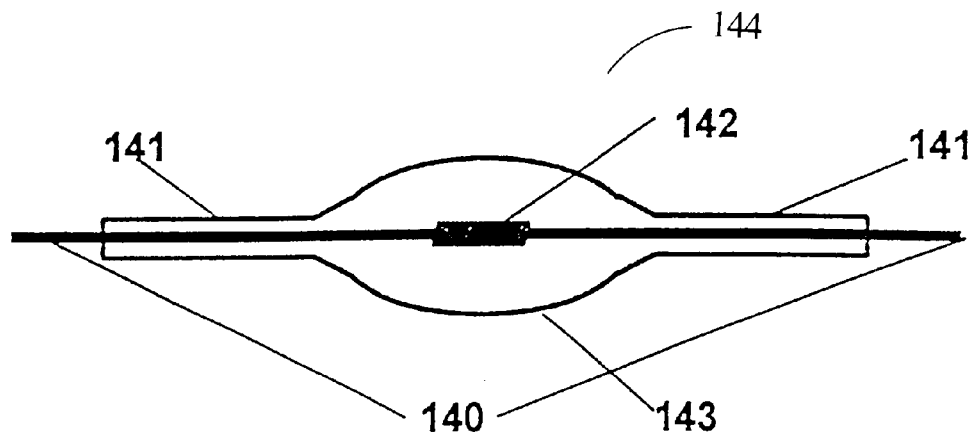
FIG. 14a is a side view of a typical lamp burner to be coated.

FIG. 14a illustrates a typical lamp burner 144 with electrical leads 140 that connect to a lamp filament 142 sealed at opposite ends into elongated tubular end pieces 141. The filament 142 is located within a bulbous central section 143 symmetrical with respect to a line passing through the electrical leads 140.

Figure 14B:
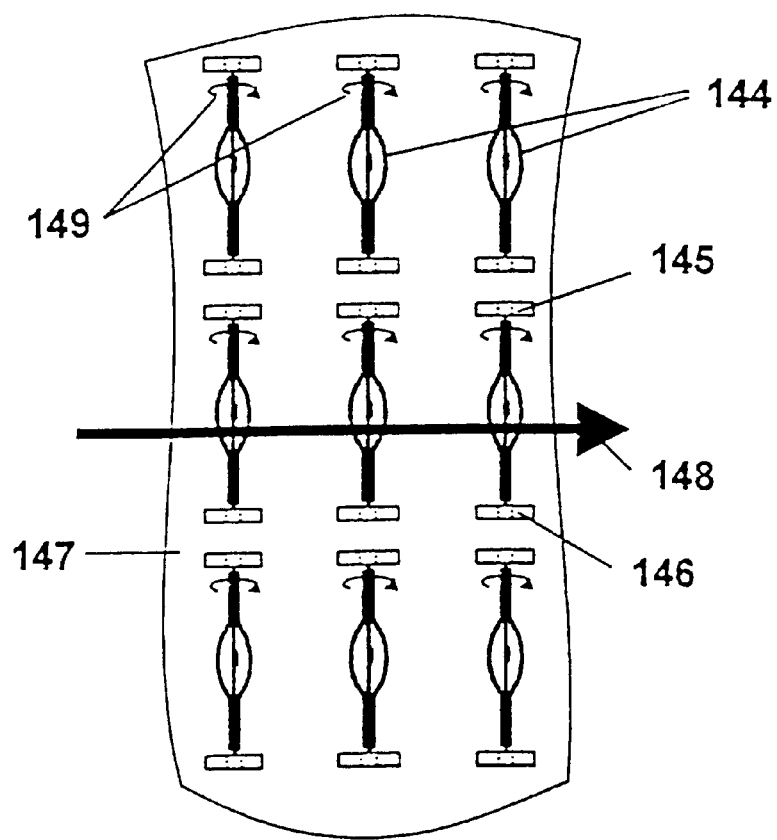
FIG. 14b is a schematic representation of a number of burners of FIG. 14a being coated by a prior art process.

FIG. 14b discloses a known system for coating lamp burners in which the lamp burners 144 are individually held at both ends by supports 145 and 146 attached to the drum 147. The drum 147 rotates in the direction of the arrow 148 and the supports 145 and 146 rotate the burners as shown by the arrow 149. Sputtering targets, which are elongated in the direction of the axis of rotation of the drum and the burners, deposit material on the rotating burners. Because the rate of material deposition on a particular burner depends on the location of the burner relative to the sputtering targets, this system produces different coatings on each burner.

Figure 15:
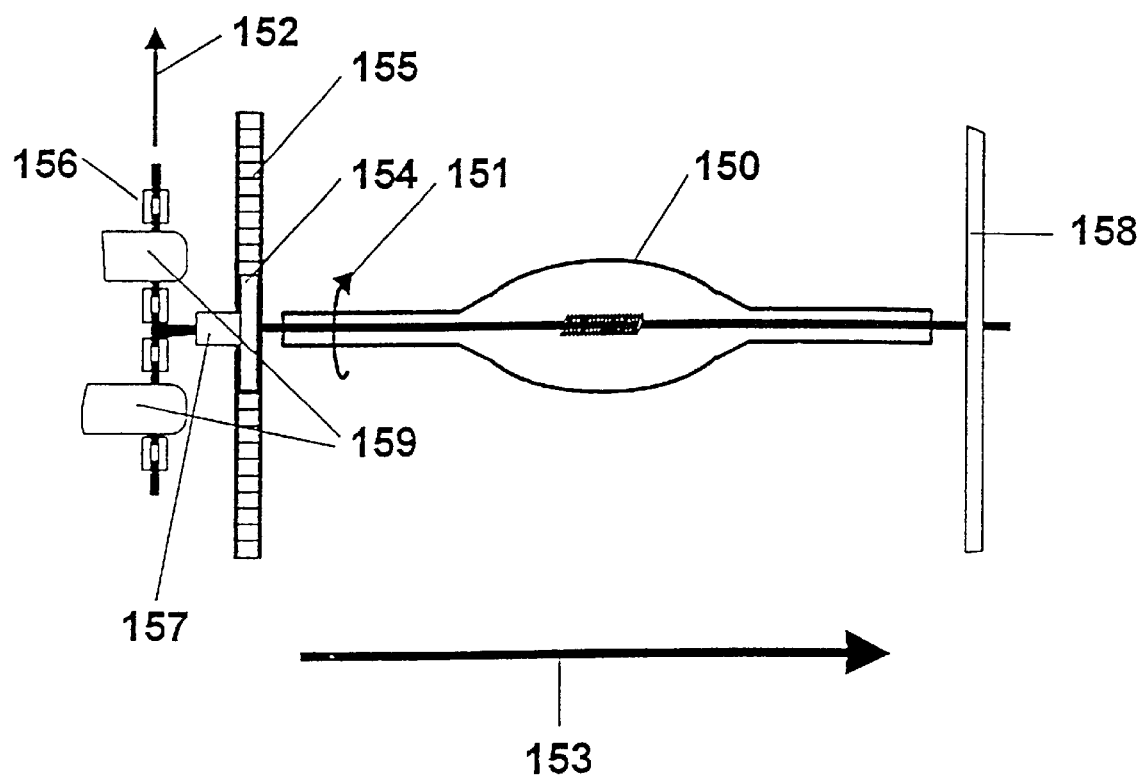
FIG. 15 is a schematic representation of the rotation mechanism and second transport mechanism for a single lamp burner to be coated.

FIG. 15 illustrates an embodiment of the present invention which yields improved uniformity of coating in a lamp burner coating process. As disclosed in FIG. 15, a burner 150 may be mounted on a mechanism that rotates the burner 150 as shown by the arrow 151 while the burner 150 moves along the surface of the drum as indicated by the arrow 152 and the drum rotates in the direction of the arrow 153.

The rotation mechanism may include a notched wheel 154, gear or sprocket that travels along an elongated, notched bar or rack 155. The notched wheel 154 is affixed to one of the leads of the burner 150 and rides along the rack located beneath it. A second transport mechanism 156 for moving the burner and wheels in the direction of second motion is attached to the rotating mechanism. The second transport mechanism 156 causes the notched wheel 154 to roll along the rack 155. The second transport mechanism 156 contains a bearing 157 that permits rotation of the notched wheel. The notched wheel 154 is constrained to move in the rack 155 by an elongated restraint 158 and flanges 159. The restraint 158 secures the burner 150 on the side opposite the wheel 154, while the flanges 159 secure the second transport mechanism 156 so that the wheel 154 rides in the rack 155.

Figure 16:
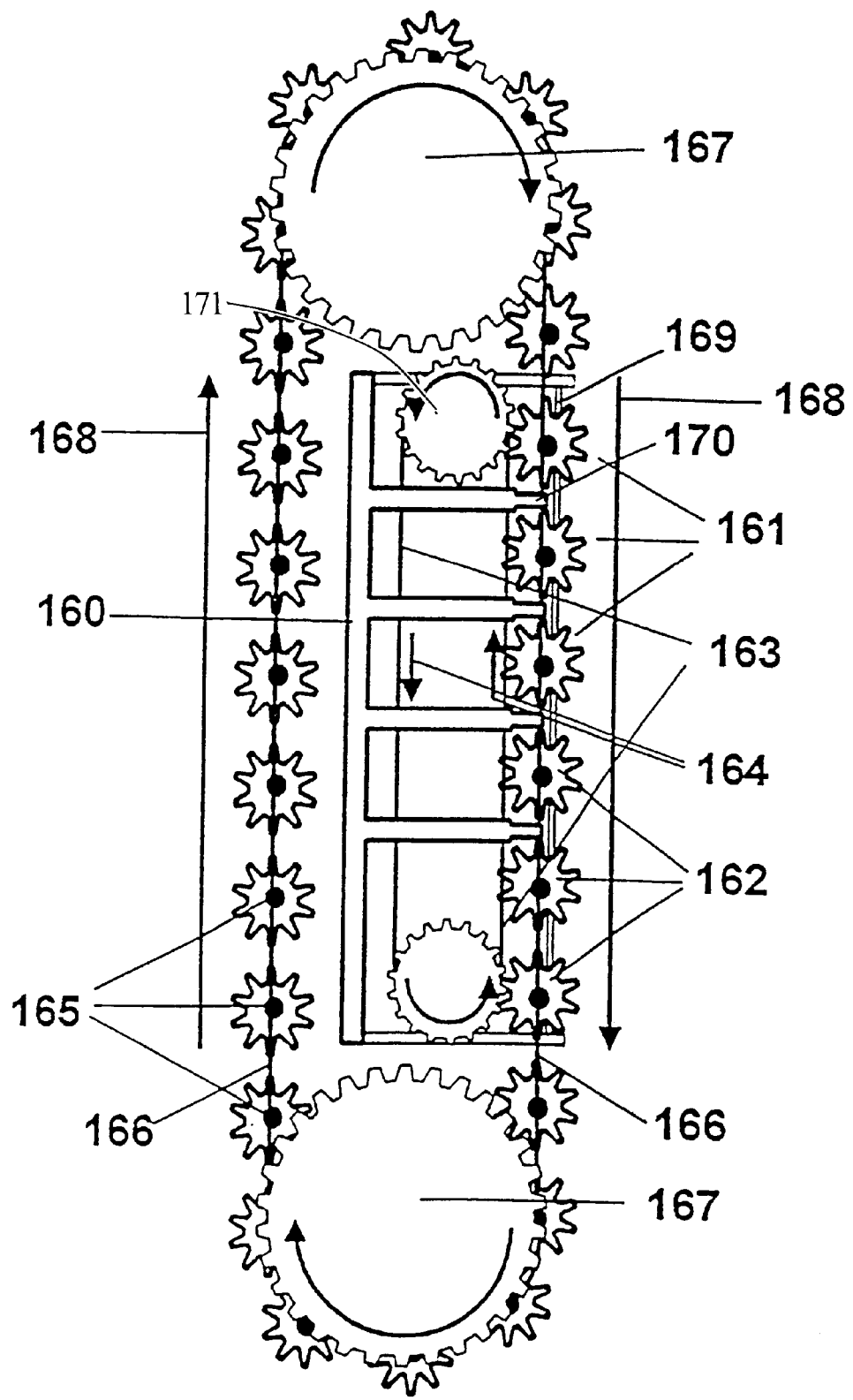
FIG. 16 is an elevation in cross section taken through a rotating drum.

FIG. 16 is a cross-sectional view of the embodiment of FIG. 15 in use with a rotating drum 160. Each burner is mounted in a rotation mechanism 161 which includes wheels 162. The rotation mechanism 161 has been modified from that shown in FIG. 15 to include a moving double chain 163 instead of a stationary rack 155. The sprockets 171 engage the chain 163 and cause the double chain 163 to move in the direction of the arrows 164. The wheels 162 are shown as sprockets that engage the other half of the double chain 163. As in FIG. 15, each wheel houses a bearing 165 that allows the wheel to rotate the burner affixed thereto. The linear motion of the burners is created by the second transport mechanism 166 which is driven by the notched drive wheels 167 to carry the burners on a closed path through the regions on the radially inside and the outside of the drum with the arrows 168 showing the direction of the linear motion. During travel on at least the radially outside of the drum 160, the rotating substrates are exposed to deposited material from sputtering targets located on the chamber wall. Where no deposition takes place within the drum, rotation of the burners stops as contact between the wheel 162 and the chain 163 is lost on the inside of the drum.

The system illustrated in FIG. 16 may further include a restraining mechanism 169 on the end of the burner opposite from the wheel 162. The restraining mechanism may be an elongated bar similar to that depicted in FIG. 15 and a second restraining mechanism 170 may be used to restrain the linear motion mechanism 166 to ensure that the wheels 162 engage the chain 163. The rotation rate of the burners may be selected independently from the rate that the burners move along the surface of the drum, because of the use independent rotation mechanisms 161 and second transport mechanism 166. For example, a low rate of linear second motion may be combined with a high rate of burner rotation by selecting a high rate of motion of the chain 163.

The number of burners transported by the mechanism shown in FIG. 16 may be increase by increasing the height to width ration of the drum in order to provide space for more burners. In a coating process, mechanisms disclosed in FIG. 16 may be placed adjacent one another around the circumference of the drum in order to process a large number of burners in a single batch. Sputtering targets, preferably elongated in a direction parallel to the second motion, are mounted on the wall of the chamber.

While FIG. 16 shows the chain 166 passing through the interior of the drum 160, the entire mechanism may be mounted on the outside of the drum in order to facilitate loading and unloading of the coating machine.

The present invention provides a coating process in which all substrates experience substantially the same environment during the process. Thus, the coatings applied to all substrates will possess similar properties. However, non-uniform coating thickness on a substrate may occur if material is deposited during certain portions of the path of second motion. For example, the locations on the substrates which are farthest from the center of the closed path will receive less material than the other portions of the substrates system disclosed in FIG. 12 where the sputtering target has a length comparable to the distance between the two points 122. On average, all substrates will receive slightly more deposition on the half of the substrate which is situated on the inside of the closed loop. Uniform thickness may, however, be achieved by providing a shield that covers the substrates while on the circular portion of the path.

Shielding may also be provided to prevent any deposition while substrates are out of the deposition region. Such shielding would prevent deposition of low energy material and material which impinges at large angles of incidence resulting in an improvement of film quality.

Residual gradients in deposition thickness may be eliminated by providing for rotary motion of a substrate about the center point. For example, in the embodiment of FIG. 10, a rotary motion of the circular substrate holder may be provided.

The present invention provides for the simultaneous coating of a batch of substrates with coatings of different thicknesses. Different coating thicknesses may be obtained by mounting the substrates on pallets and covering each pallet with a mask corresponding to the desired coating thickness. Substrates on the same pallet receive the same amount of deposition material. Thus, a single coating process may produce substrates with coatings of varying thicknesses, limited only by the number of masks that may be employed at the same time. A wide variety of masks may be used including one suitable for the removal of thickness gradients on the edge of the substrates. Masks may be used, for example, to fabricate a number of narrow band filters whose pass bands had different center frequencies.

Masking may also be used in the sputtering process disclosed in FIGS. 7 and 8 for the coating of concave spherical lenses having surfaces with different radii. The coating on the concave spherical surface is uniform over the lens, but the coating thickness generally decreases as the power of the lense increases. Masks may be used to selectively block deposition material on the lenses in each lot or pallet so that the process may be used to coat lenses of different powers during the same coating process.

A coating with a high level of uniformity may be achieved even when objects are placed between the material sources and the target. Such objects might comprise tubes for conveying reacting gas to the substrate surface in a reactive sputtering process, or a collimator provided to prevent atoms of the deposition material from striking the substrate with a high angle of incidence.

Figure 17:
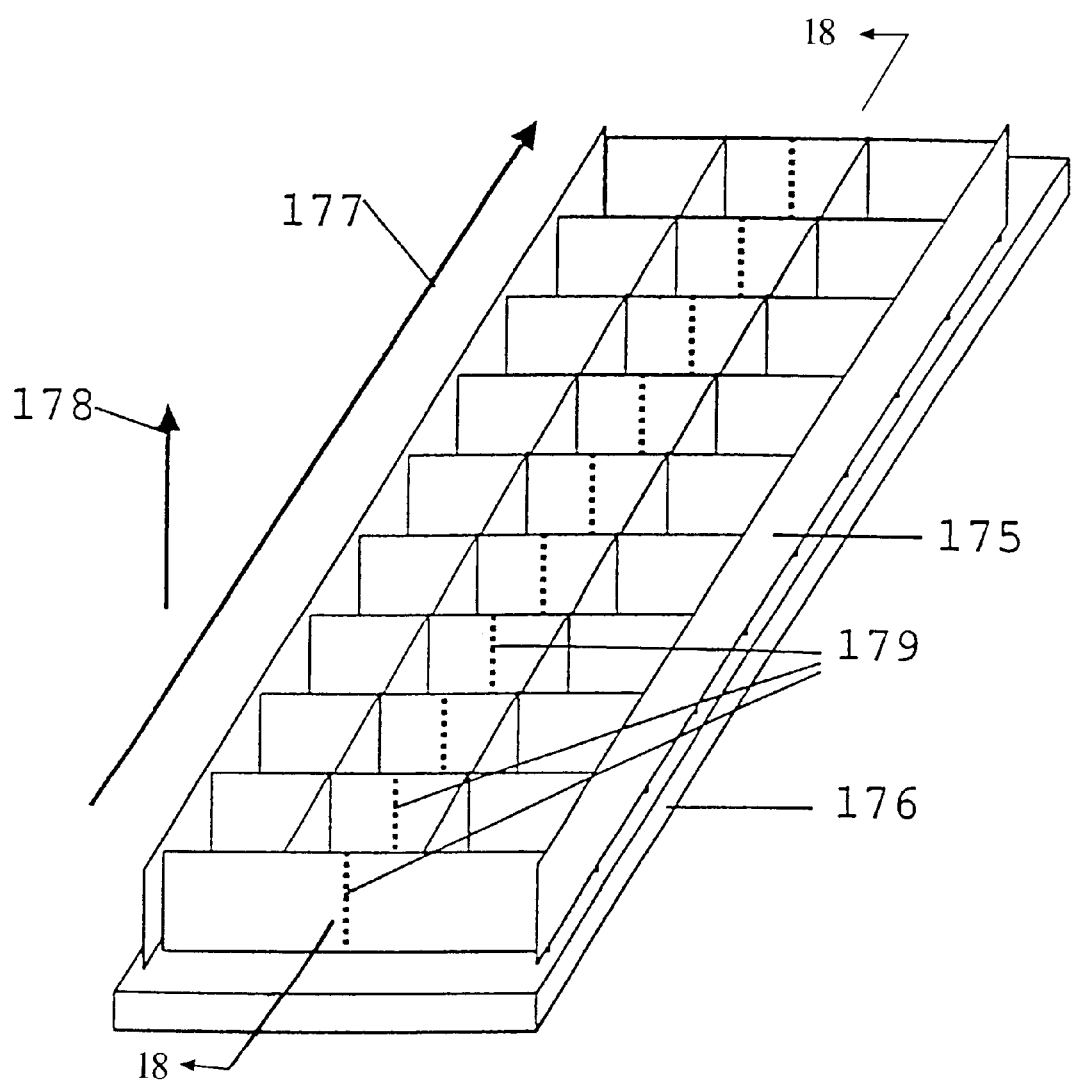
FIG. 17 is a pictorial view of a collimator attached to an elongated sputtering target.

The present invention may be used with a beam collimator. A collimator may take many forms, but typically includes strips of metal attached together to form a rectangular pattern such as illustrated in FIG. 17 where the collimator 175 is adjacent to an elongated sputtering target 176. The target 176 may be part of a magnetron target assembly and the target 176 may be attached to the collimator 175 so that position of the collimator with respect to the target remains fixed during the process. The target 176 with a collimator may be mounted on the wall of a coating chamber with the long axis of the target generally along the z direction perpendicular to the direction of first motion as indicated by the arrow 177. The y direction perpendicular to the target emitting surface and parallel to the faces of the collimator strips is indicted by the arrow 178.

Figure 18A:
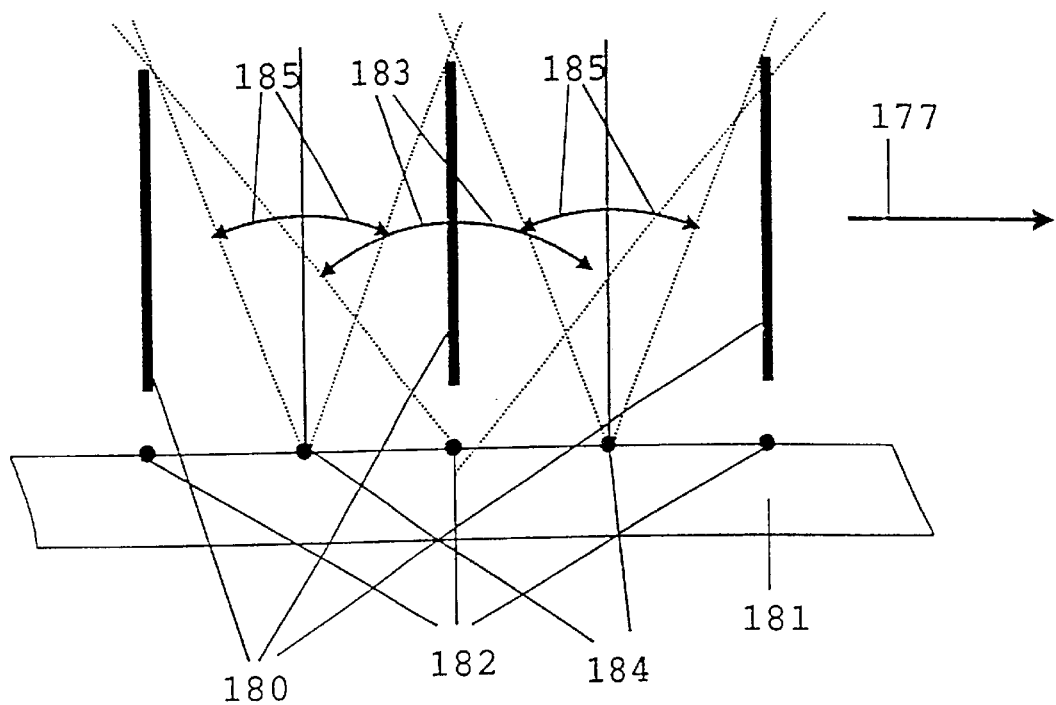
FIG. 18a is a cross sectional view through taken through 18—18 of FIG. 17.

FIG. 18a is a cross-section through the collimator of FIG. 17 in a plane parallel to the yz plane and passing through the dotted lines 179 of FIG. 17. The z-axis lies in the direction of the arrow 177. The blades 180 of the collimator are separated from the target and block a portion of the emissions from the surface of the sputtering target 176. As shown, the collimator blocks material that is emitted from the target at high angles with respect to the y direction (i.e. perpendicular to the target surface). For emissions from the points 182, for example, the collimator blocks emissions having angles greater than the angles 183. Of course the collimator also blocks some emissions at very small angles due to the width of the blades of the collimator. Similarly, emissions from point 184 are blocked if the emitted angle with respect to the y direction is greater than the angle 185. Thus, the blocking effects of the collimator depend on the location of the target from which emission occurs, but in general an emission having an angle greater than the angle 183 will not reach the substrate.

Figure 18B:
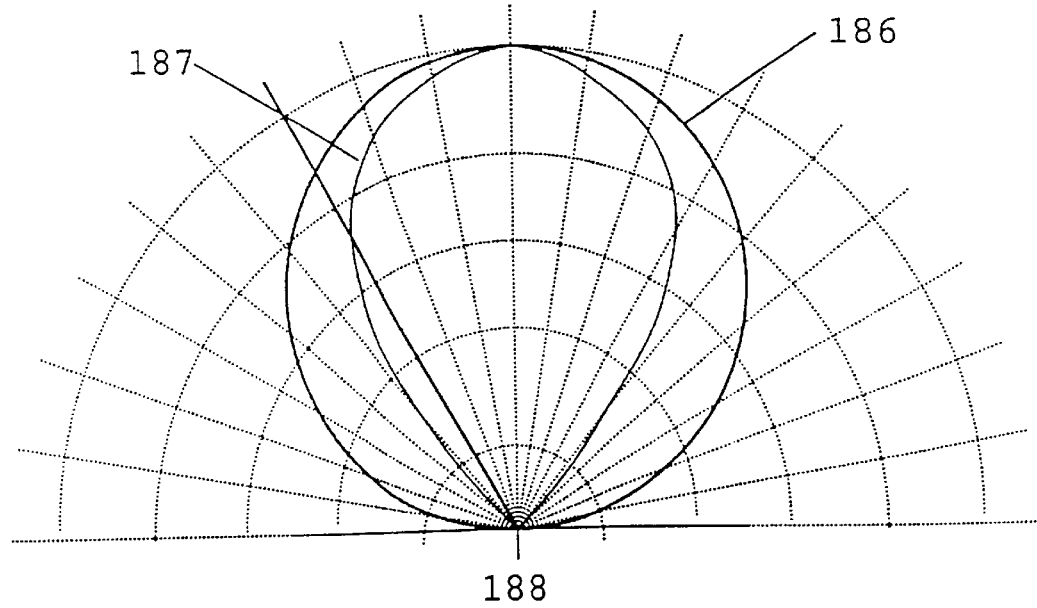
FIG. 18b is a chart showing the distribution of angles of material emitted from sputter targets with and without collimators.

FIG. 18a depicts only one plane parallel to the yz plane. When all emission planes are considered, the effect of the collimator on the angular distribution of emitted material may be obtained as shown in FIG. 18b in the plot of the beam patterns produced by the target and collimator considering all points on the target surface. The plot 186 shows a typical beam pattern of a target without a collimator and the plot 187 shows a typical beam pattern produced by a sputtering target assembly including a collimator. Both plots 186 and 187 are polar plots in which the coordinates of a point are the amount or emission per unit solid angle and the angle made with the y direction by a line pointing in the direction of the emission. Lines of equal emission per unit solid angle are dotted circles in FIG. 18b, and lines of equal emission angle are the dotted lines radiating from the origin 188. A comparison of the plots 186 with 187 indicates that a collimator increases the percentage of material moving from the target to the substrate emitted with a relatively small angle to the y direction.

Figure 19A:
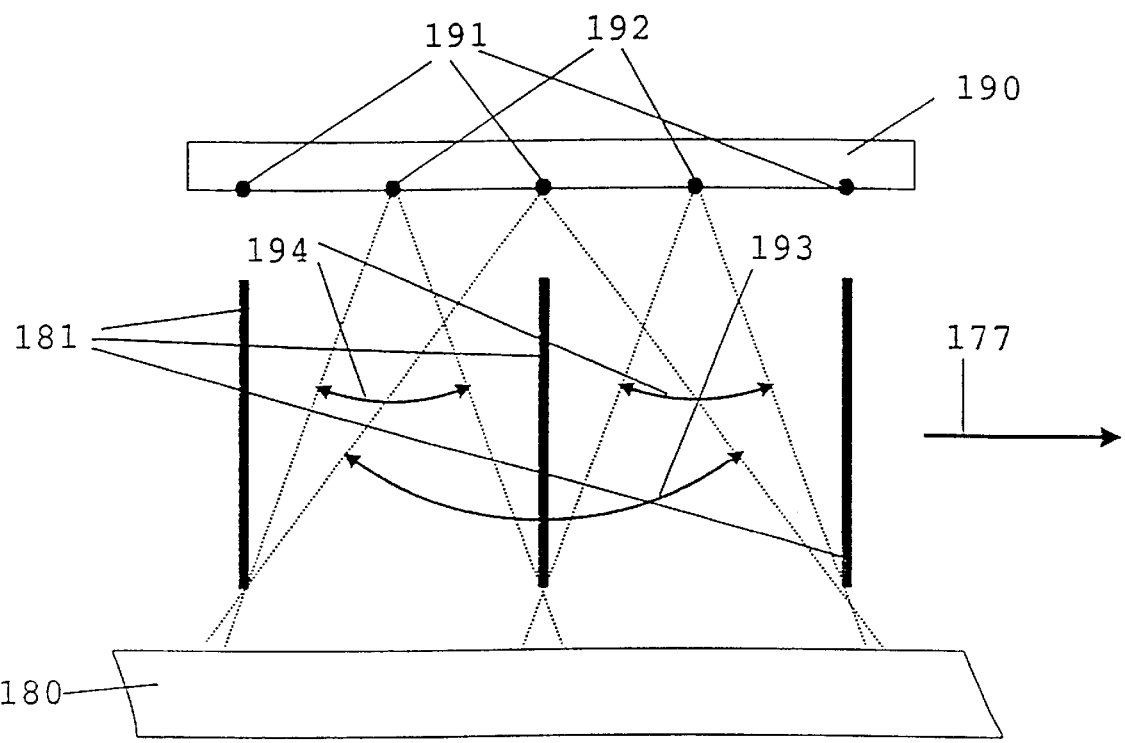
FIG. 19a is a schematic representation illustrating the relationship of the collimator and target of FIG. 17 and a substrate to be coated.

FIG. 19a illustrates the section of FIG. 18a and includes a substrate 190 upon which the emitted material falls. Collimator blades 180 are located between the emitting surface of the target and the substrate. Points 191 on the substrate are located directly above the blades, and points 192 are located on the substrate midway between points 191. The collimator causes a variation in the thickness of the deposited coating over the substrate 190 because the angle 193 includes the region within which material emitted from the target will strike the point 191 while point 192 will receive material emitted in the smaller angle 194 and thus the thickness of the deposited material at points 192 will be less than the thickness of the deposition at points 191.

Figure 19B:
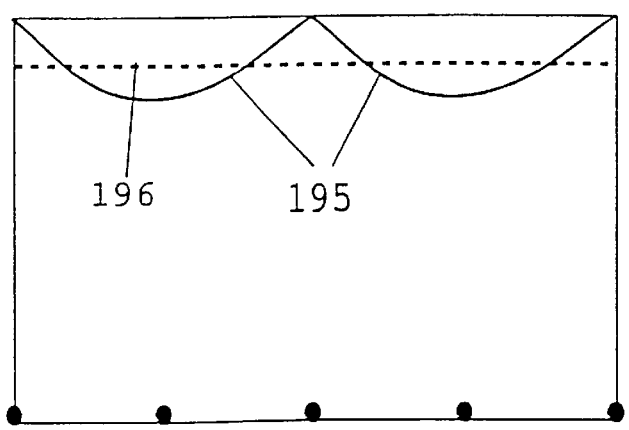
FIG. 19b is a chart showing the variation of coating thickness on the substrate coated by a process that includes a collimator.

Curve 195 of FIG. 19b is a plot of relative deposition thickness as a function of the z coordinate for points in the plane of FIG. 19a. The ordinate is the relative deposition, expressed as the ratio between the thickness and the maximum thickness. The abscissa is the z coordinate of the point whose thickness is plotted. The locations of the points 191 and 192 are indicated by solid dots.

In many prior art processes, the beneficial result of low incidence angles on film quality is achieved at the expense of a loss of uniformity of the film thickness. Movement of the substrates in the direction of first motion does not adversely affect deposition thickness; however, periodic variations in thickness may still occur in the z direction as depicted in FIG. 19b. The non-uniformity in the z direction may be eliminated by the present invention producing a constant average level as shown by the dashed line 196 in FIG. 19b. This may be accomplished by selecting the relative magnitude of the first and second motion so that a few revolutions of the drum, for example, occur before the substrate returns to the same location relative to any of the vanes of the collimator. The proper selection may be achieved by selecting the first and second motion such that the second motion carries each substrate through a small fraction of its diameter during a single drum revolution. Thus the present invention allows the attainment of low incidence angles without degrading the deposition uniformity.

Use of a collimator with a planar or concave substrate has the beneficial result of improving film quality. A second beneficial effect may occur in a process for coating a lamp reflector 200 such as shown in FIG. 20a and FIG. 20b. The lamp reflector is symmetrical with respect to rotation about the axis 201, and a plane passing through the axis intersects its inner reflecting surface 202 to form a parabola or ellipse. The reflector 200 has a flange 203 at its wide end that is useful for holding the part during coating of the inner surface.

In a concave reflector, material entering the wide end of the reflector at a large angle with the axis 201 preferentially deposits on the surface closest to the target. Thus, the coating deposited is thickest at the outer edges of the reflector and thinnest at the point where the axis intersects the reflecting surface. Therefore, a coating thickness gradient, known as "axial runout", is encountered when coating the reflector without a collimator. When the collimator is present, the portion of the material entering the collimator with a velocity that makes a given angle with the axis 201 is reduced. The pointed beam formed by the collimator penetrates the reflector and increases the deposition at the deepest point and thus the collimator may be designed to eliminate axial runout.

Prior art processes also result in thickness variations such as those illustrated in FIG. 19b. The coating thickness variation with position on a circle parallel to the outer circumference of the opening is known as "circumferential runout" and may be eliminated by the use of a collimator in the configuration shown in FIG. 21.

As shown in FIG. 21, a portion of a second transport mechanism, such as shown in FIG. 12, includes a chain 204 attached to substrate holders 205 by a fastening mechanism 206. The substrate holders 205 enclose substrates 208 and may be cylindrical. A sputtering target assembly 209, elongated in the direction of arrow 207, may be attached to the chamber wall 210. Within the target assembly is the sputtering target 176. A collimator 175 may be attached to the target assembly. The blades within the collimator are indicated by the dotted lines 211.

The mechanism imparts a movement to the holders in the direction of the arrow 207 along the closed loop path of the substrates. The substrates also move in the direction opposite to that indicated by the arrow 207 in FIG. 21 during movement around the closed loop. As a result of the fact that all parts travel in substantially the same path relative to the material sources for the duration of the process, the method of the present invention produces coated parts that are free of axial or circumferential runout, and have excellent part-to-part uniformity.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. In a method of depositing a layer of material on an array of substrates in which the array is moved past one or more sources of material, the improvement wherein each substrate in the array of substrates moves along a common path relative to each of said sources.

2. The method of claim 1 wherein said array is planar and is moved in a first rotational motion while superimposing a second non-rotational motion of the substrates on said first motion.

3. The method of claim 1 wherein said array is planar and is moved in a first linear motion while superimposing a second motion of the substrates on said first motion.

4. The method of claim 1 wherein said array is cylindrical and is moved in a first rotational motion while superimposing a second motion of the substrates on said first motion.

5. The method of claim 1 wherein one or more of said sources of material comprise a magnetron sputtering target.

6. In a process of depositing a layer of material on an array of substrates in which the array is moved past one or more sources of deposition material, a method of improving the uniformity of the layer deposited on the substrates comprising the second motion changes the position of the substrates relative to the first motion carrier.

7. In a deposition process in which a planar array of substrates is moved past one or more sources of deposition material in a first rotational motion while concurrently moving the array of substrates in a second motion, the improvement wherein said second motion is non-rotational.

8. In a deposition process in which a planar array of substrates is moved past one or more sources of deposition material in a first motion while superimposing a second motion of the array of substrates on said first motion, the improvement wherein said superimposed motion is non-rotational.

9. The process of claim 8 wherein the combination of said first and second motions move each of the substrates along a common path relative to said sources.

10. The process of claim 8 wherein said planar array of substrates rotates about an axis substantially perpendicular to said array while superimposing a radial motion of the substrates on said rotational motion.

11. The process of claim 8 wherein said planar array of substrates moves in a first linear motion while superimposing a second linear motion of the substrates on said first linear motion, said second linear motion being transverse to said first linear motion.

12. A deposition process comprising the steps:
    (a) moving a planar array of substrates past one or more sources of deposition material in a first motion; and
    (b) concurrently moving the substrates in a second motion, said second motion moving the substrates along a linear path substantially perpendicular to the direction of the first motion.

13. A method of depositing material on an array of substrates comprising the steps of:
    (a) moving the array of substrates past one or more sources of deposition material in a first motion; and
    (b) concurrently moving the array of substrates in a second motion,
    wherein the combination of said first and second motions move each of the substrates in the array of substrates along a common path relative to said sources.

14. The method of claim 13 wherein said array is a cylindrical array and the step of moving the array of substrates in a first motion comprises rotating the cylindrical array about its longitudinal axis.

15. The method of claim 14 wherein said step of moving said substrates in a second motion comprises moving the substrates along a path substantially parallel to the axis of rotation of the cylindrical array.

16. The method of claim 15 wherein said cylindrical array of substrates comprises a plurality of groups of substrates spaced radially about the axis of rotation, each of said groups comprising an axial column of a plurality of substrates moving in said second motion along a common linear path.

17. The method of claim 15 wherein said cylindrical array of substrates comprises a plurality of groups of substrates spaced about the periphery of a cylindrical carrier, each of said groups of substrates comprising a plurality of substrates, said second motion moving each group of a plurality of substrates along a linear path substantially parallel to said axis of rotation of said carrier.

18. The method of claim 17 wherein said cylindrical carrier comprises an outer and an inner surface, said second motion moving said groups of substrates in one direction adjacent the outer surface of said carrier and in the opposite direction adjacent the inner surface of said carrier.

19. The method of claim 17 wherein said second motion moves each group of a plurality of substrates along an elongated racetrack path substantially parallel to said axis of rotation of said carrier.

20. The method of claim 14 wherein one or more of said sources of deposition material comprise a magnetron sputtering target.

21. The method of claim 13 wherein said array is a planar array and said step of moving the array of substrates in a first motion comprises moving the array along a linear path.

22. The method of claim 21 wherein said step of moving said substrates in a second motion comprises moving the substrates along a path substantially perpendicular to the direction of the first motion.

23. In a short throw deposition process in which an array of substrates is moved past one or more deposition sources on a first motion carrier while concurrently moving the array of substrates in a second motion, the improvement wherein
   a second carrying means attached to the first carrying means for moving a plurality of substrate holders relative to the first carrying means along a linear path substantially parallel to the longitudinal axis of one or more of said targets;
   a plurality of substrate holders carried by said second carrying means, each of said holders having an attachment surface and being adapted for removable attachment to one or more substrates.

24. In a short throw deposition process in which an array of substrates is moved past one or more deposition sources on a first motion carrier while concurrently moving the array of substrates in a second motion, the improvement wherein the second motion does not change the position of the carrier relative to the sources.

25. In an apparatus for depositing a layer of material on an array of substrates carried past one or more sources of deposition material on a cylindrical surface rotating about its longitudinal axis wherein the axial position of said cylindrical surface relative to said sources does not change, a method of improving the uniformity of the layer of deposited material on the array of substrates comprising the step of concurrently moving the substrates in two motions relative to the position of said sources.

26. In a method of depositing a layer of material on an array of substrates, the method including the steps of:

(a) moving said substrates in a first motion past one or more sources of deposition material, said first motion comprising rotating a cylindrical array of said substrates about the longitudinal axis of the cylindrical array; while (b) concurrently rotating each substrate about its longitudinal axis;

the improvement comprising the step of:

(c) concurrently moving the substrates in a second motion wherein said second motion moves the substrates in a direction substantially parallel to the axis of rotation of said cylindrical array,
   wherein the combination of said first and second motions move each substrate along a common path relative to said sources.

27. The method of claim 26 wherein said cylindrical array of substrates comprises a plurality of groups of substrates spaced radially about the axis of rotation, each of said groups comprising an axial column of a plurality of substrates moving in said second motion along a common linear path.

28. The method of claim 26 wherein said cylindrical array of substrates comprises a plurality of groups of substrates spaced about the periphery of a cylindrical carrier, each of said groups of substrates comprising a column of a plurality of substrates having an axis substantially parallel to said axis of rotation, said second motion moving each column of a plurality of substrates along the axis of said column.

29. The method of claim 28 wherein said cylindrical carrier comprises an outer and an inner surface, said second motion moving said groups of substrates in one direction adjacent the outer surface of said carrier and in the opposite direction adjacent the inner surface of said carrier.

30. An apparatus for depositing a layer of material on an array of substrates attached thereto, said apparatus comprising:
   a first carrier means for moving the array of substrates in a first motion past one or more sources of deposition material; and
   one or more second carrier means for concurrently moving the array of substrates in a second motion, said second means being carried by said first means,
   wherein the combination of said first and second carrier means moves each of the substrates in the array of substrates along a common path relative to said sources.

31. The apparatus of claim 30 wherein said first carrier means comprises a planar surface rotatable about an axis substantially perpendicular to said surface.

32. The apparatus of claim 31 wherein said second carrier means moves the substrates carried thereon radially from said axis of rotation.

33. The apparatus of claim 31 wherein said second carrier means comprises a plurality of substrate holders and a means for carrying the plurality of substrate holders along a common linear path, each of said substrate holders being adapted for removable attachment to a substrate.

34. The apparatus of claim 33 wherein said linear path is along a radius from said axis of rotation.

35. The apparatus of claim 31 wherein said second carrier means comprises a plurality of substrate holders and a means for carrying the plurality of substrate holders along a common elongated racetrack path, said path having two linear portions substantially parallel to a radius extending from said axis, each of said substrate holders being adapted for removable attachment to a substrate.

36. The apparatus of claim 30 wherein said first carrier means comprises a cylindrical surface rotatable about its longitudinal axis.

37. The apparatus of claim 36 wherein said second carrier means moves said substrates along a path substantially parallel to said longitudinal axis.

38. The apparatus of claim 37 comprising a plurality of second carrier means positioned about said cylindrical surface.

39. The apparatus of claim 38 wherein one or more of said sources of deposition material comprise a magnetron sputtering target.

40. The apparatus of claim 36 wherein said second carrier means comprises a plurality of substrate holders and a means for carrying the plurality of substrate holders along a common linear path substantially parallel to said longitudinal axis, each of said substrate holders being adapted for removable attachment to a substrate.

41. The apparatus of claim 40 wherein said second carrier means further comprises means for rotating said substrates attached thereto.

42. The apparatus of claim 36 wherein said second carrier means comprises a plurality of substrate holders and a means for carrying the plurality of substrate holders along a common elongated racetrack path, said path having two linear portions substantially parallel to said longitudinal axis, each of said substrate holders being adapted for removable attachment to a substrate.

43. The apparatus of claim 42 further comprising shield means for preventing the deposition of material on said substrates when the substrates are not on said linear portions of said racetrack path.

44. The apparatus of claim 30 wherein said first carrier means comprises a planar surface movable along a first linear path.

45. The apparatus of claim 44 wherein said second carrier means moves said substrates along a path substantially perpendicular to said first linear path.

46. The apparatus of claim 45 wherein one or more of said sources of deposition material comprise a magnetron sputtering target.

47. The apparatus of claim 45 wherein said second carrier means comprises a plurality of substrate holders and a means for carrying the plurality of substrate holders along a common linear path substantially perpendicular to said first linear path, each of said substrate holders being adapted for removable attachment to a substrate.

48. The apparatus of claim 30 wherein said second carrier means comprises a plurality of substrate holders and a means for carrying the plurality of substrate holders along a common linear path, each of said substrate holders being adapted for removable attachment to a substrate.

49. The apparatus of claim 30 further comprising a collimator.

50. The apparatus of claim 30 wherein one or more of said sources of deposition material comprise a magnetron sputtering target.

51. An apparatus for depositing a layer of material on an array of substrates attached thereto, said apparatus comprising:
   a first carrier means for moving the substrates in a first motion past one or more sources of deposition material, said first carrier means comprising a planar surface rotatable about an axis substantially perpendicular to said surface; and
   one or more second carrier means for concurrently moving the substrates in a second motion, said second means being carried by said first means and comprising a plurality of substrate holders and a means for carrying the plurality of substrate holders along a common linear path extending radially from said axis of rotation, each of said substrate holders being adapted for removable attachment to a substrate,
   wherein the combination of said first and second carrier means moves each of the substrates along a common path relative to said sources.

52. An apparatus for depositing a layer of material on an array of substrates attached thereto, said apparatus comprising:
   a first carrier means for moving the substrates in a first motion past one or more sources of deposition material, said first carrier means comprising a cylindrical surface rotatable about its longitudinal axis; and
   one or more second carrier means for concurrently moving the substrates in a second motion, said second means being carried by said first means and comprising a plurality of substrate holders and a means for carrying the plurality of substrate holders along a common linear path substantially parallel to said longitudinal axis, each of said substrate holders being adapted for removable attachment to a substrate,
   wherein the combination of said first and second carrier means moves each of the substrates along a common path relative to said sources.

53. An apparatus for depositing a layer of material on an array of substrates attached thereto, said apparatus comprising:
   a first carrier means for moving the substrates in a first motion past one or more sources of deposition material, said first carrier means comprising a planar surface movable along a first linear path; and
   one or more second carrier means for concurrently moving the substrates in a second motion, said second means being carried by said first means and comprising a plurality of substrate holders and a means for carrying the plurality of substrate holders along a common linear path substantially perpendicular to said first linear path, each of said substrate holders being adapted for removable attachment to a substrate,
   wherein the combination of said first and second carrier means moves each of the substrates along a common path relative to said sources.

54. In an apparatus for depositing a layer of material on an array of substrates carried by a rotating drum past one or more sources of deposition material, the improvement wherein a second carrier means changes the position of the substrates relative to the drum.

55. In an apparatus for depositing a layer of material on an array of substrates including a drum for carrying the substrates in a first motion past one or more sources of deposition material by rotation of the drum about its longitudinal axis wherein the axial position of said drum relative to said sources does not change, the improvement comprising a carrier means for concurrently moving the substrates in a second motion to improve the uniformity of the layer deposited on the substrates.

56. In a process for depositing a layer of material on a plurality of substrates carried transversely past one or more elongated sputtering targets on a first carrying means, an apparatus for carrying said substrates along a path substantially parallel to the longitudinal axis of one or more of said targets, said apparatus comprising:
   the step of moving each substrate in the array of substrates along a common path relative to each of said sources.

57. The apparatus of claim 56 further comprising a means for rotating the substrates attached thereto about an axis substantially perpendicular to said attachment surface.

58. The apparatus of claim 56 further comprising a means for rotating the substrates attached thereto about an axis substantially parallel to said attachment surface.

59. The apparatus of claim 56 wherein said carrying means carries said plurality of substrate holders along an elongated racetrack path having two linear portions substantially parallel to the longitudinal axis of one or more of said targets.

60. The apparatus of claim 59 further comprising shield means for shielding the substrates carried by said apparatus from said sputtering targets when the substrates are not carried along said linear portions of said racetrack path.

61. In a process of depositing a layer of material on an array of substrates wherein the array is moved past one or more elongated sputtering targets in a direction transverse to said elongated targets on a substrate array carrier, one or more of said targets having means for shielding said substrates from sputtered material having an angle of incidence to said substrates greater than a predetermined angle of incidence, a method of improving the uniformity of the layer deposited on the substrates comprising the step of concurrently moving each substrate along the longitudinal axes of said elongated targets without moving the substrate array carrier along its longitudinal axis relative to the targets.

62. The method of claim 61 wherein said array of substrates is moved past said targets on a cylindrical surface rotatable about its longitudinal axis and said shielding means comprises a collimator positioned between said cylindrical surface and said target.

* * * * *